(12) United States Patent
Iwata

(10) Patent No.: US 10,355,472 B2
(45) Date of Patent: Jul. 16, 2019

(54) OVER TEMPERATURE PROTECTION CIRCUIT AND SEMICONDUCTOR DEVICE

(71) Applicant: FUJI ELECTRIC CO., LTD., Kawasaki-shi, Kanagawa (JP)

(72) Inventor: Hideki Iwata, Azumino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 79 days.

(21) Appl. No.: 15/799,539

(22) Filed: Oct. 31, 2017

(65) Prior Publication Data

US 2018/0069393 A1 Mar. 8, 2018

Related U.S. Application Data

(63) Continuation of application No. PCT/JP2016/079467, filed on Oct. 4, 2016.

(30) Foreign Application Priority Data

Nov. 19, 2015 (JP) .................................. 2015-226616

(51) Int. Cl.
*H02H 5/04* (2006.01)
*H03K 17/08* (2006.01)
(Continued)

(52) U.S. Cl.
CPC .............. *H02H 5/04* (2013.01); *H02H 5/044* (2013.01); *H02H 7/222* (2013.01); *H03K 5/1252* (2013.01); *H03K 17/08* (2013.01); *H02P 29/68* (2016.02); *H02P 2209/07* (2013.01); *H03K 2017/0806* (2013.01)

(58) Field of Classification Search
CPC ................................ H02H 5/04; H02H 5/044
See application file for complete search history.

(56) References Cited

U.S. PATENT DOCUMENTS

| 7,545,653 B2 * | 6/2009 | Itagaki | H01L 21/761 257/620 |
| 2003/0174453 A1 * | 9/2003 | Hsu | H02H 3/08 361/78 |

(Continued)

FOREIGN PATENT DOCUMENTS

| JP | H02-053086 A | 2/1990 |
| JP | H05-027033 A | 2/1993 |

(Continued)

*Primary Examiner* — Scott Bauer
(74) *Attorney, Agent, or Firm* — Rabin & Berdo, P.C.

(57) ABSTRACT

An over temperature protection circuit includes a temperature sensor unit, a detection unit, and a filter unit. The temperature sensor unit detects a temperature and outputs a temperature detection signal. The detection unit has a first threshold for determining whether a temperature state is a normal state, and a second threshold for determining whether the temperature state is an over temperature state; and operates with respect to an internal ground. The detection unit determines the normal state or the over temperature state, based on the level of the temperature detection signal with respect to the first threshold and the second threshold; and outputs a state signal. The filter unit filters out a change of the state signal, produced in accordance with a change of the internal ground.

11 Claims, 26 Drawing Sheets

(51) Int. Cl.
 *H03K 5/1252* (2006.01)
 *H02H 7/22* (2006.01)
 *H02P 29/68* (2016.01)

(56) References Cited

U.S. PATENT DOCUMENTS

| | | |
|---|---|---|
| 2006/0153277 A1 | 7/2006 | Yoshida |
| 2008/0031304 A1 | 2/2008 | Nishimura |
| 2011/0068818 A1 | 3/2011 | Fukami |
| 2012/0201063 A1 | 8/2012 | Sugawara |
| 2012/0287684 A1 | 11/2012 | Fahlenkamp |
| 2013/0106175 A1* | 5/2013 | Takeo .................... F02D 41/28 307/9.1 |

FOREIGN PATENT DOCUMENTS

| | | |
|---|---|---|
| JP | H07-115354 A | 5/1995 |
| JP | 2000-307403 A | 11/2000 |
| JP | 2006-194885 A | 7/2006 |
| JP | 2006-302951 A | 11/2006 |
| JP | 2008-058298 A | 3/2008 |
| JP | 2011-071174 A | 4/2011 |
| JP | 2013-509141 A | 3/2013 |

* cited by examiner ns particularly pointed out in the claims.

OVER TEMPERATURE PROTECTION CIRCUIT AND SEMICONDUCTOR DEVICE

CROSS-REFERENCE TO RELATED APPLICATION

This application is a continuation application of International Application PCT/JP2016/079467 filed on Oct. 4, 2016 which designated the U.S., which claims priority to Japanese Patent Application No. 2015-226616, filed on Nov. 19, 2015, the entire contents of which are incorporated herein by reference.

BACKGROUND OF THE INVENTION

1. Field of the Invention

The embodiments discussed herein are related to an over temperature protection circuit and a semiconductor device.

2. Background of the Related Art

In recent years, there have been developed semiconductor devices, called intelligent power switches (IPSs), in each of which a switching element using a power semiconductor element, a drive circuit used for the switching element, a control circuit arranged around the drive circuit, and a protection circuit are incorporated in one chip.

The IPSs are widely used for, for example, automotive electrical systems of transmission, engine, and brake; and are desired to be produced for downsizing, higher performance, and higher reliability.

By the way, a conventional art proposes a technique which regulates voltages by using a clamping voltage of a Zener diode, to prevent malfunction of a circuit.

See, for example, U.S. Patent Application Publication No. 2012/0287684.

In a high-side IPS, a switching element is interposed between the positive terminal of a power supply and a load. In the high-side IPS, a voltage is produced from a power supply voltage such that the voltage becomes lower than the power supply voltage by a predetermined level, and supplied to circuits of the IPS, as an internal ground used to drive the circuits.

The internal ground is also supplied to an over temperature protection circuit of the IPS, which is used to detect rise or fall in temperature during the operation of the IPS. This configuration, however, may cause malfunction of the over temperature protection circuit and reduce its temperature detection accuracy, when the internal ground changes.

SUMMARY OF THE INVENTION

In one aspect of the embodiments, there is provided an over temperature protection circuit including: a temperature sensor unit configured to detect a temperature and output a temperature detection signal; a detection unit configured to determine, based on comparing the temperature detection signal to a first threshold and a second threshold, whether the temperature corresponds to a normal temperature state corresponding to the first threshold or an over temperature state corresponding to the second threshold and to output a state signal according to the determination, and to operate with respect to an internal ground; and a filter unit configured to filter out a change of the state signal, produced in accordance with a change of the internal ground.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, some embodiments will be described with reference to the accompanying drawings.

Figure 1A:
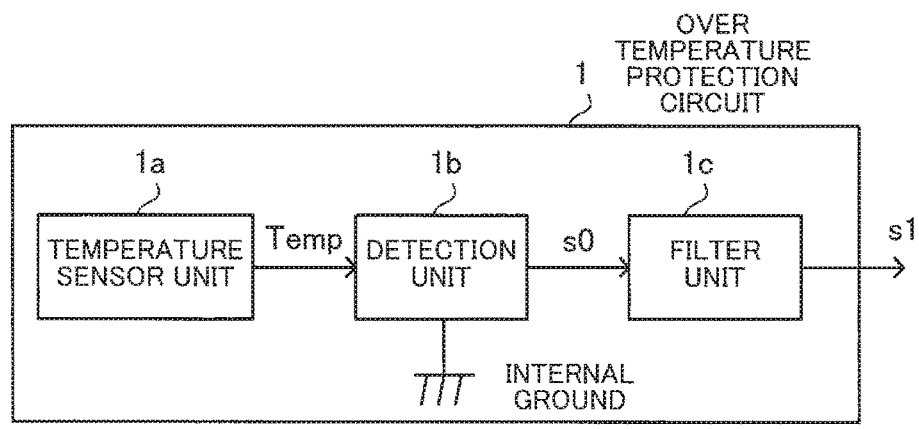
FIG. 1A illustrates an example of a configuration of an over temperature protection circuit.

FIG. 1A illustrates an example of a configuration of an over temperature protection circuit. An over temperature protection circuit 1 includes a temperature sensor unit 1a, a detection unit 1b, and a filter unit 1c. The temperature sensor unit 1a detects a temperature, and outputs a temperature detection signal Temp.

The detection unit 1b has a first threshold for determining whether a temperature state is a normal state, and a second threshold for determining whether the temperature state is an over temperature state; and operates with respect to the internal ground. The normal state is a temperature state in which the temperature of an apparatus does not exceed a rated value. The over temperature state is a temperature state in which the temperature has exceeded the rated value and the apparatus is overheated.

The detection unit 1b determines the normal state or the over temperature state, based on the level of the temperature detection signal Temp with respect to the first threshold and the second threshold; and outputs a state signal s0. The filter unit 1c filters out the change of the state signal s0 (that is, applies a low-pass filter to the state signal s0), which is produced by the change of the internal ground; and outputs a state notification signal s1.

Figure 1B:
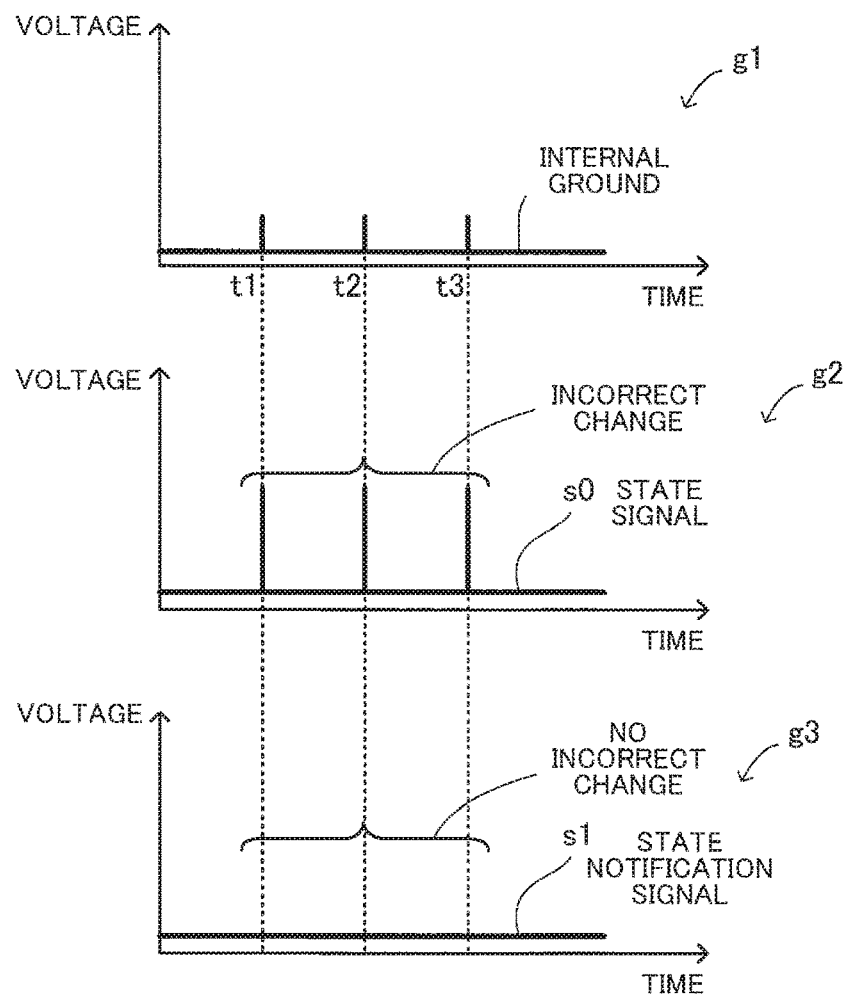
FIG. 1B illustrates a state signal whose level depends on change of an internal ground, and a state notification signal.

FIG. 1B illustrates the state signal whose level depends on the change of the internal ground, and the state notification signal. The vertical axis represents voltage, and the horizontal axis represents time. A graph g1 indicates a waveform of the internal ground; a graph g2 indicates a waveform of the state signal s0; and a graph g3 indicates a waveform of the state notification signal s1.

In FIG. 1B, the internal ground changes at times t1, t2, and t3. When the internal ground changes, the state signal s0 outputted from the detection unit 1b also changes, because the detection unit 1b operates with respect to the internal ground. As countermeasures to this problem, the over temperature protection circuit 1 includes the filter unit 1c after the detection unit 1b.

The filter unit 1c filters out the change of the state signal s0. As a result, the state notification signal s1, used to notify whether the temperature state is the over temperature state, does not incorrectly change when the internal ground changes.

In this manner, because the over temperature protection circuit 1 outputs the state notification signal s1 that does not incorrectly change when the internal ground changes, the over temperature protection circuit 1 makes a notification of a correct temperature state and prevents reduction in the temperature detection accuracy.

Next, some semiconductor devices, such as Intelligent Power Switches (IPSs), will be described. These semiconductor devices are grouped into two types: in one type, an internal ground used for a charge pump is shared by an over temperature protection circuit; in the other type, an internal ground used for a charge pump is different from an internal ground used for an over temperature protection circuit. Hereinafter, each type will be described.

Figure 2:
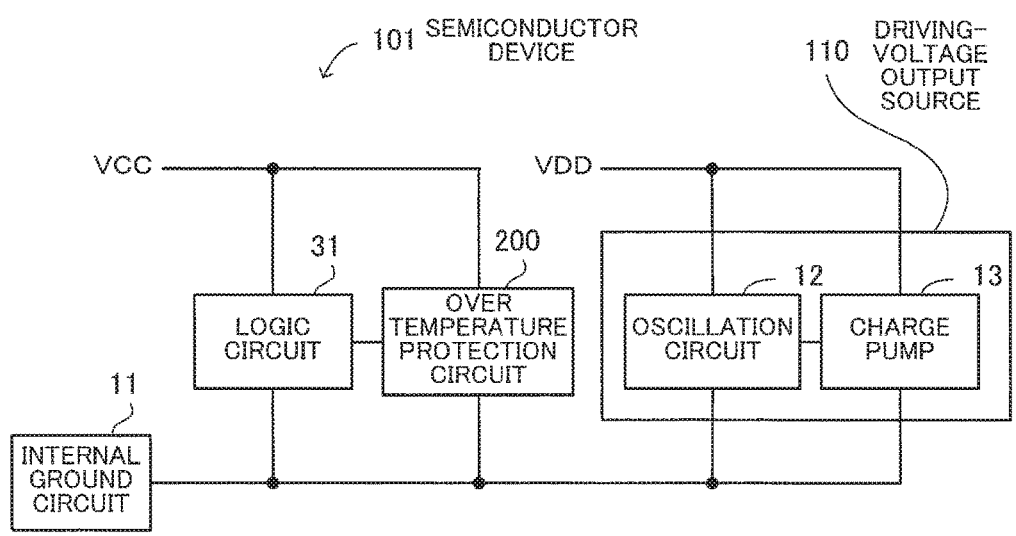
FIG. 2 illustrates an example of a configuration of a semiconductor device.

FIG. 2 illustrates an example of a configuration of a semiconductor device. A semiconductor device 101 belongs to a type in which an internal ground used for a charge pump is shared by an over temperature protection circuit.

The semiconductor device 101 includes a driving-voltage output source 110, an over temperature protection circuit 200, a logic circuit 31, and an internal ground circuit 11. The driving-voltage output source 110 includes an oscillation circuit 12 and a charge pump 13.

The driving-voltage output source 110 is supplied with a power supply voltage VDD and an internal ground generated by the internal ground circuit 11. On the other hand, the over temperature protection circuit 200 and the logic circuit 31 are supplied with a power supply voltage VCC and the internal ground generated by the internal ground circuit 11.

The power supply voltage VCC is an external power supply voltage. The power supply voltage VDD is generated in the semiconductor device 101 by using the power supply voltage VCC, and supplied to the circuits to reliably turn on transistors of the semiconductor device 101. The internal ground is a reference voltage whose level is lowered from the power supply voltage VCC by a predetermined level, to drive circuits of the semiconductor device 101.

Figure 3:
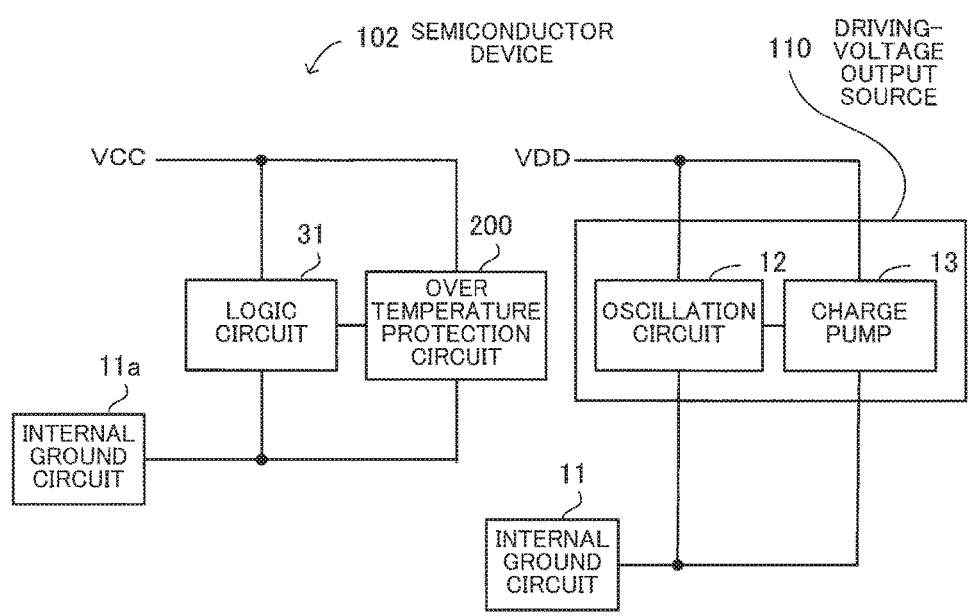
FIG. 3 illustrates an example of a configuration of a semiconductor device.

FIG. 3 illustrates an example of a configuration of a semiconductor device. A semiconductor device 102 belongs to a type in which an internal ground used for a charge pump is different from an internal ground used for an over temperature protection circuit.

The semiconductor device 102 includes the driving-voltage output source 110, the over temperature protection circuit 200, the logic circuit 31, the internal ground circuit 11, and an internal ground circuit 11a. The driving-voltage output source 110 includes the oscillation circuit 12 and the charge pump 13.

The driving-voltage output source 110 is supplied with the power supply voltage VDD and the internal ground generated by the internal ground circuit 11. On the other hand, the over temperature protection circuit 200 and the logic circuit 31 are supplied with the power supply voltage VCC and an internal ground generated by the internal ground circuit 11a.

Figure 4:
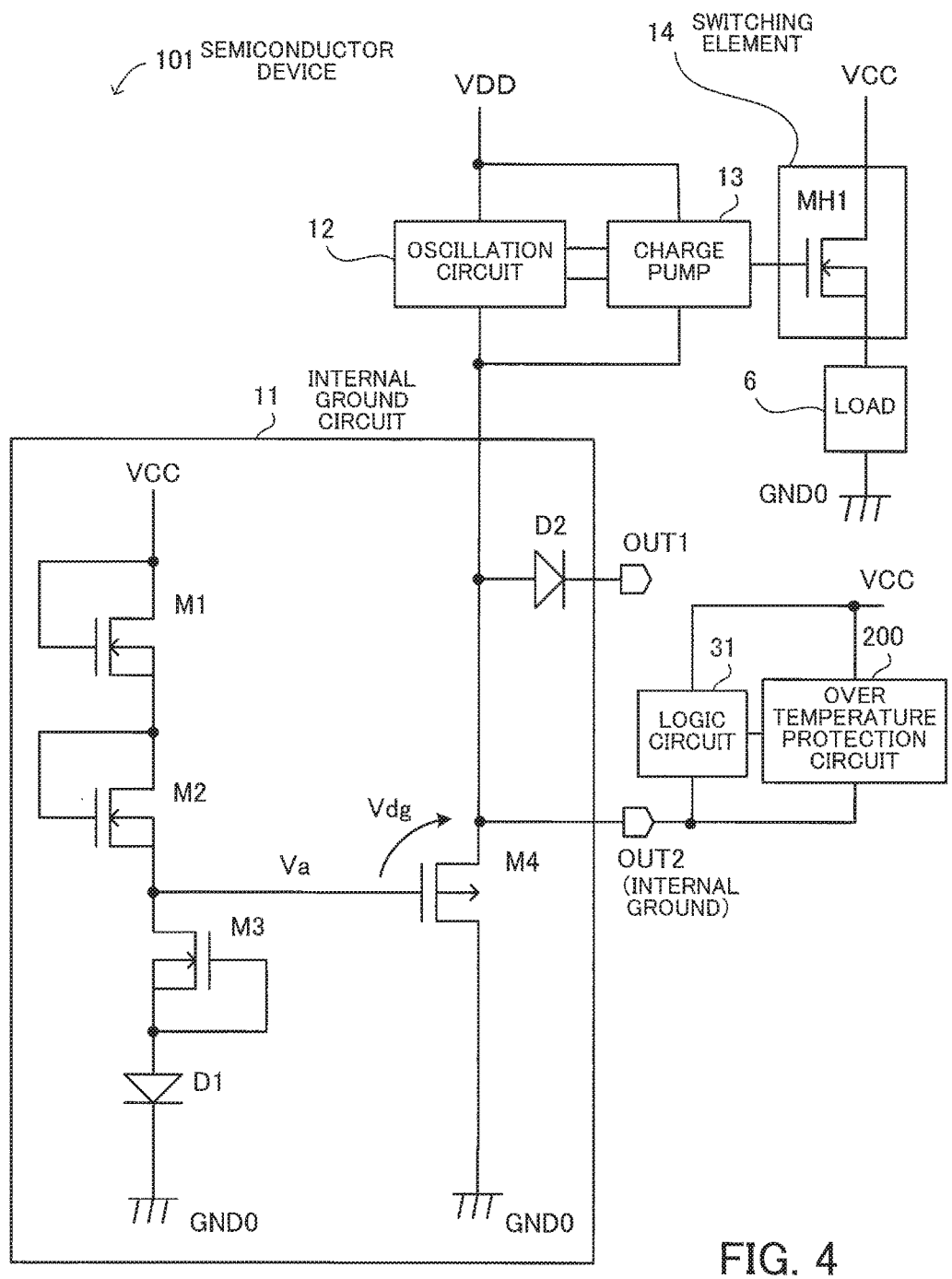
FIG. 4 illustrates an example of a configuration of a semiconductor device.
Figure 5:
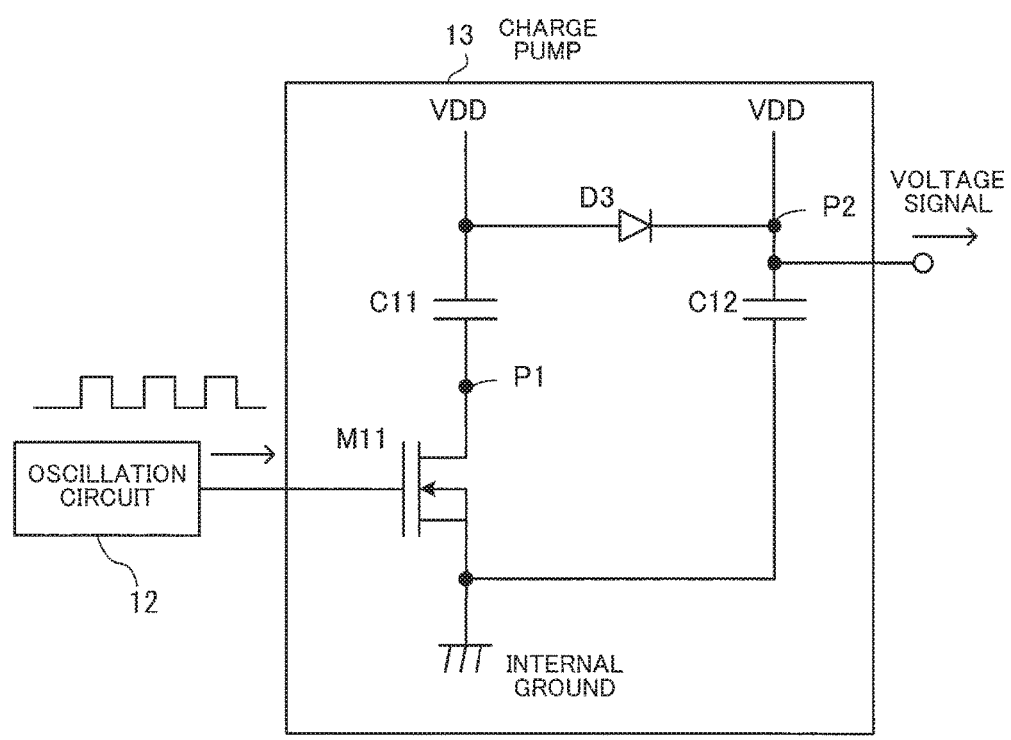
FIG. 5 is a diagram for explaining a voltage boosting operation of a charge pump.

First, the change of the internal ground of the semiconductor device 101 will be described with reference to FIGS. 4 to 6. FIG. 4 illustrates an example of a configuration of a semiconductor device. In the figures, a symbol GND0 denotes the ground having a voltage of 0V.

The semiconductor device 101 is connected to a load 6; and includes the internal ground circuit 11, the oscillation circuit 12, the charge pump 13, the over temperature protection circuit 200, the logic circuit 31, and a switching element 14. The semiconductor device 101 may be a high-side IPS.

The internal ground circuit 11 includes NMOS transistors M1 to M3, which are N-channel metal oxide semiconductor field effect transistors (MOSFETs); a PMOS transistor M4, which is a P-channel MOSFET; and diodes D1 and D2. The switching element 14 uses an NMOS transistor MH1 which serves as a power MOSFET.

Components are connected as follows. The power supply VCC is connected to the drain and the gate of the NMOS transistor M1. The source of the NMOS transistor M1 is connected to the drain and the gate of the NMOS transistor M2.

The source of the NMOS transistor M2 is connected to the drain of the NMOS transistor M3 and the gate of the PMOS transistor M4. The gate of the NMOS transistor M3 is connected to the source of the NMOS transistor M3 and the anode of the diode D1. The cathode of the diode D1 is connected to the ground GND0.

The power supply VDD is connected to one power-supply terminal of the oscillation circuit 12 and one power-supply terminal of the charge pump 13. The oscillation circuit 12 and the charge pump 13 are connected with each other. The output terminal of the charge pump 13 is connected to the gate of the NMOS transistor MH1.

The drain of the NMOS transistor MH1 is connected to the power supply VCC. The source of the NMOS transistor MH1 is connected to one end of the load 6. The other end of the load 6 is connected to the ground GND0.

The other power-supply terminal of the oscillation circuit 12 is connected to the other power-supply terminal of the charge pump 13, the anode of the diode D2, an output terminal OUT2, and the drain of the PMOS transistor M4. The source of the PMOS transistor M4 is connected to the ground GND0. The cathode of the diode D2 is connected to an output terminal OUT1. The other power-supply terminals of the oscillation circuit 12 and the charge pump 13 are connected to the internal ground.

In addition, the power supply VCC is connected to the over temperature protection circuit 200 and the logic circuit 31. The over temperature protection circuit 200 and the logic circuit 31 are connected with each other. The output terminal OUT2 is connected to the over temperature protection circuit 200 and the logic circuit 31.

In the internal ground circuit 11, the NMOS transistors M1 and M2 are diode-connected, and the NMOS transistor M3 and the diode D1 constitute a current drawing part.

In the example of FIG. 4 in which the two diode-connected NMOS transistors M1 and M2 are used, the voltage of the source of the NMOS transistor M2 is expressed by $$VCC - Vds1 \times 2$$

where Vds1 is a voltage between the drain and the source of each of the NMOS transistors M1 and M2.

Thus, the voltage, which is obtained by dividing the power supply voltage VCC, is outputted as a voltage Va. The voltage Va is applied to the gate of the PMOS transistor M4. As a result, the drain of the PMOS transistor M4 outputs a voltage expressed by $$Va + Vdg$$

where Vdg is a voltage between the drain and the gate of the PMOS transistor M4. The voltage is supplied to the over temperature protection circuit 200 and the logic circuit 31 via the output terminal OUT2, as the internal ground.

The internal ground is also supplied to the oscillation circuit 12 and the charge pump 13. Here, the two diode-connected transistors are used in this example, but a desired number of diode-connected transistors may be used.

Next, a reason of the change of the internal ground of the semiconductor device 101 will be described. In the semiconductor device 101, the change of the internal ground is mainly caused by voltage boosting operation of the charge pump.

The charge pump repeats charging and discharging a capacitor at high speed by using the oscillation circuit, to charge another capacitor. As a result, this operation easily causes the internal ground to change significantly.

First, the operation of the charge pump 13 will be described. In order for the NMOS transistor MH1, which serves as a main switch, to be fully turned on to drive the load 6, a voltage of, for example, 28V is applied to the gate of the NMOS transistor MH1.

However, the power supply voltage VCC of the semiconductor device 101 is 13V, for example. For this reason, the charge pump 13 boosts the gate voltage from the power supply voltage VCC of 13V, by charging a capacitor to an extent in which the NMOS transistor MH1 is fully turned on. That is, the charge pump 13 turns on the NMOS transistor MH1 by applying the boosted gate voltage to the gate of the NMOS transistor MH1.

Next, one example of the voltage boosting operation of the charge pump 13 will be described. FIG. 5 is a diagram for explaining a voltage boosting operation of the charge pump 13. The charge pump 13 includes an NMOS transistor M11, a diode D3, and capacitors C11 and C12.

Components are connected as follows. The gate of the NMOS transistor M11 is connected to the output terminal of the oscillation circuit 12. One end of the capacitor C11 is connected to the power supply VDD and the anode of the diode D3. The other end of the capacitor C11 is connected to the drain of the NMOS transistor M11.

One end of the capacitor C12 is connected to the power supply VDD, the cathode of the diode D3, and the gate of the NMOS transistor MH1 illustrated in FIG. 4. The other end of the capacitor C12 is connected to the source of the NMOS transistor M11 and the internal ground.

The gate of the NMOS transistor M11 is applied with an oscillation signal which oscillates between a high level of voltage (hereinafter referred to as H level) and a low level of voltage (hereinafter referred to as L level). Thus, the NMOS transistor M11 is turned on when the oscillation signal has the H level.

At this time, the capacitor C11 is charged by the power supply VDD (that is, the capacitor C11 is charged until the terminal voltage of the capacitor C11 equals the power supply voltage VDD).

On the other hand, when the oscillation signal has the L level, the NMOS transistor M11 is turned off. At this time, the potential at a point P1 of FIG. 5 increases from a potential obtained when the NMOS transistor M11 is turned on. Then, the electric charges stored in the capacitor C11 move to the capacitor C12 through the diode D3.

At this time, the capacitor C12 is charged by the power supply VDD and by the electric charges from the capacitor C11. Because the electric charges correspond to a voltage of VDD, the potential at a point P2 of FIG. 5 increases to a value which is two times the voltage VDD.

With such a configuration, a sufficient amount of electric charge to fully turn on the NMOS transistor MH1 of the switching element 14 is stored in the capacitor C12. Theoretically, in the case where the power supply voltage VDD is boosted to a voltage which is n times the power supply voltage VDD, n number of circuit configurations, each configured like the above circuit configuration, will be provided.

Next, a reason of the change of the internal ground of the semiconductor device 101 will be described. As described above, the charge pump 13 repeats charging and discharging a capacitor at high speed by using the oscillation circuit 12 as a drive source, to charge another capacitor. As a result, this operation causes the internal ground to change.

Figure 6:
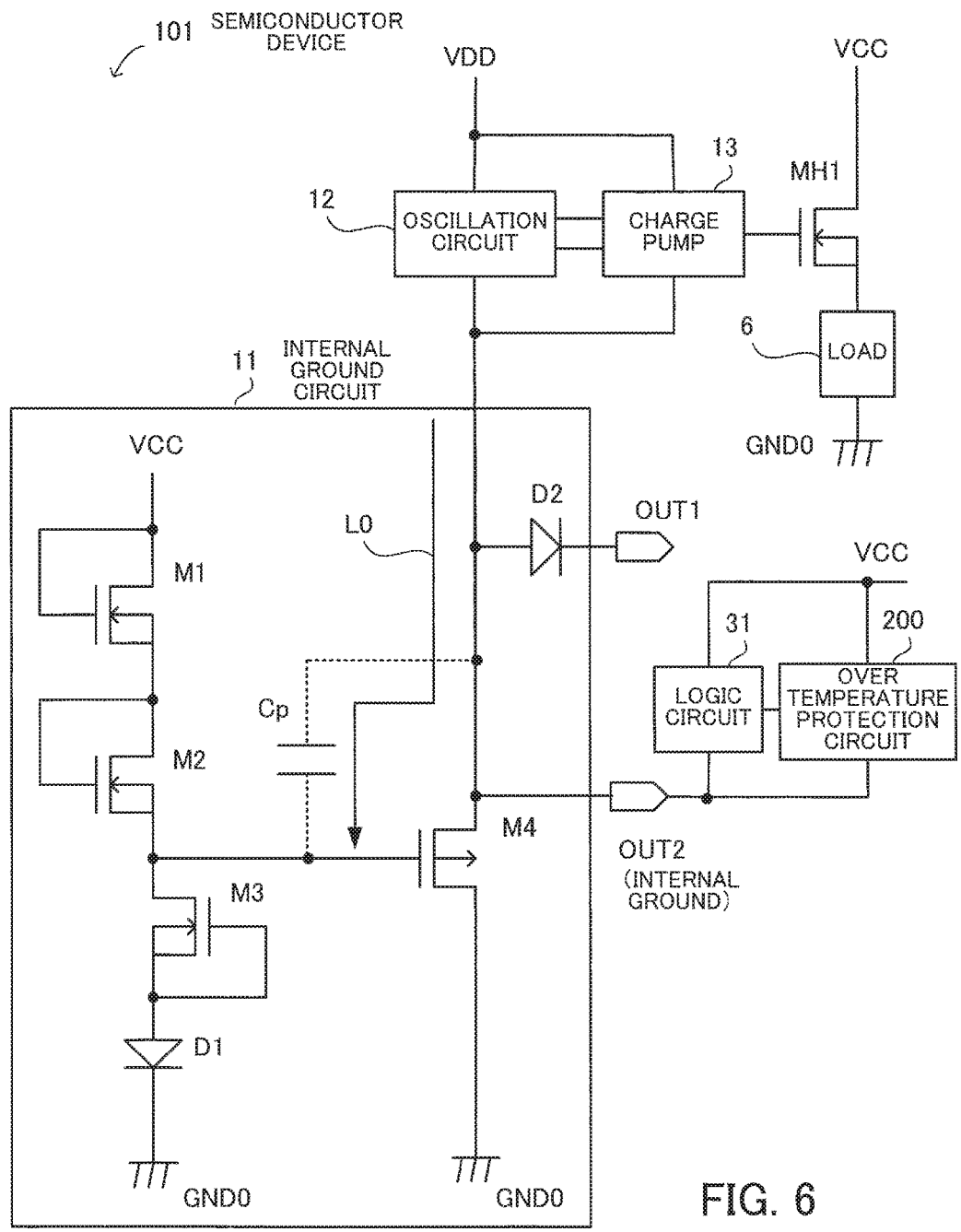
FIG. 6 is a diagram for explaining a reason of the change of the internal ground.

FIG. 6 is a diagram for explaining a reason of the change of the internal ground. In the operation, the oscillation circuit 12 oscillates and activates the charge pump 13 to turn on the NMOS transistor MH1.

Then the capacitor is charged for applying a voltage to the gate of the NMOS transistor MH1. When a voltage across the capacitor exceeds a threshold voltage of the NMOS transistor MH1, the NMOS transistor MH1 is turned on.

As described above, the charge pump 13 switches its operation between charging and discharging at high speed, to charge the capacitor. At this time, the gate of the PMOS transistor M4 is charged via a path L0 (that is, a path through which current flows from the charge pump 13 to the internal ground circuit 11 when the charge pump 13 is operated) and a parasitic capacitor Cp between the drain terminal and the gate terminal of the PMOS transistor M4.

As a result, the gate voltage of the PMOS transistor M4 changes depending on the current from the charge pump 13. This changes the current which flows through the PMOS transistor M4, changing the drain voltage of the PMOS transistor M4. That is, this causes the internal ground to change.

The internal ground is also supplied to the over temperature protection circuit 200. Thus, when the internal ground changes, it causes malfunction of the over temperature protection circuit 200, and reduces temperature detection accuracy of the over temperature protection circuit 200.

Next, the change of the internal ground of the semiconductor device 102 will be described with reference to FIGS. 7 to 11. In the semiconductor device 102 illustrated in FIG. 3, a flow-through current occurs due to switching of transistors of the logic circuit 31 when logic is changed in the logic circuit 31, and causes the change of the internal ground outputted from the internal ground circuit 11a.

Figure 7:
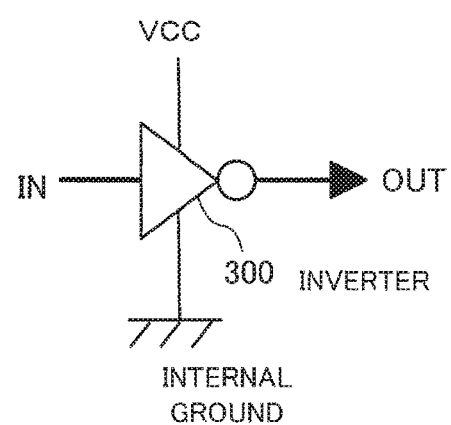
FIG. 7 illustrates an inverter element of a logic circuit.

FIG. 7 illustrates an inverter element of the logic circuit. The logic circuit 31 is constituted by complementary metal oxide semiconductors (CMOSs). In FIG. 7, an inverter 300 is illustrated as an example of CMOS elements of the logic circuit 31. The inverter 300 is supplied with the power supply voltage VCC and the internal ground from the internal ground circuit 11a. An input terminal IN of the inverter 300 receives a signal having a predetermined level, and an output terminal OUT of the inverter 300 outputs a corresponding signal.

Figure 8A:
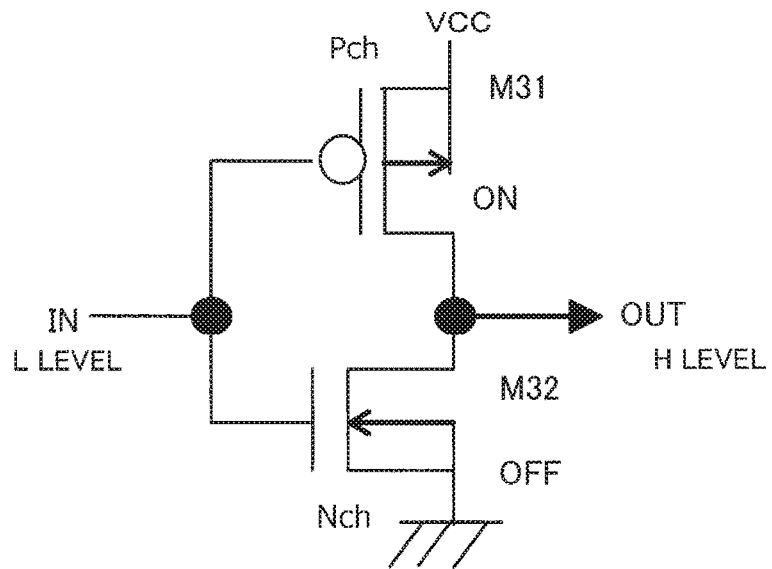
FIG. 8A illustrates operations of transistors performed when the inverter element receives an input signal having a low (L) level.
Figure 8B:
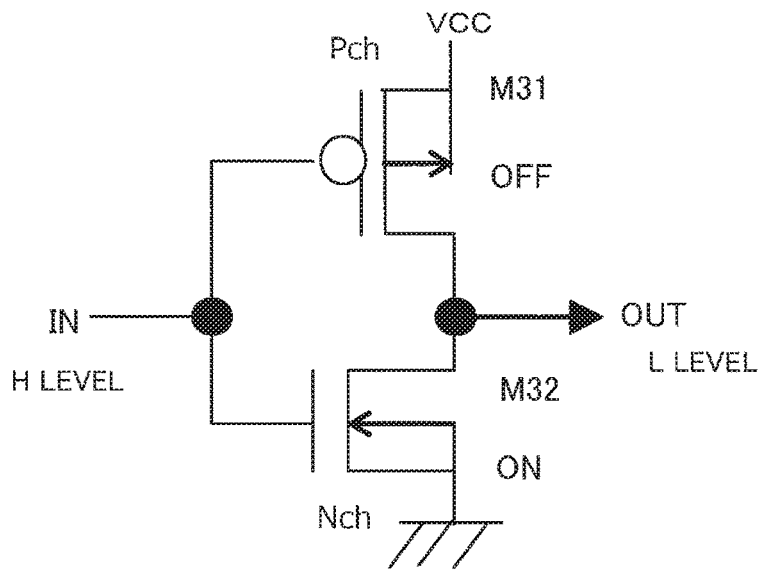
FIG. 8B illustrates operations of the transistors performed when the inverter element receives an input signal having a high (H) level.

FIGS. 8A and 8B illustrate operations of transistors constituting the inverter. FIG. 8A illustrates operations of the transistors performed when the inverter receives an input signal having the L level. FIG. 8B illustrates operations of the transistors performed when the inverter receives an input signal having the H level.

The inverter 300 includes a PMOS transistor M31 and an NMOS transistor M32. Components are connected as follows. The gate of the PMOS transistor M31 is connected to the gate of the NMOS transistor M32 and the input terminal IN.

The source of the PMOS transistor M31 is connected to the power supply VCC. The drain of the PMOS transistor M31 is connected to the drain of the NMOS transistor M32 and the output terminal OUT. The source of the NMOS transistor M32 is connected to the internal ground.

In FIG. 8A, when the input terminal IN receives a signal having the L level, the PMOS transistor M31 is turned on, the NMOS transistor M32 is turned off, and the output terminal OUT outputs a signal having the H level.

In FIG. 8B, when the input terminal IN receives a signal having the H level, the PMOS transistor M31 is turned off, the NMOS transistor M32 is turned on, and the output terminal OUT outputs a signal having the L level.

Figure 9:
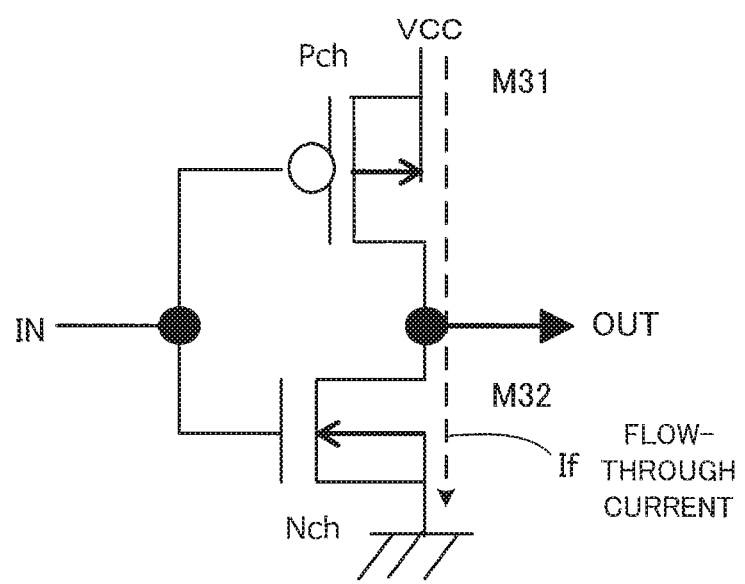
FIG. 9 illustrates a flow of a flow-through current.

FIG. 9 illustrates a flow of the flow-through current. The inverter 300 is operated by the switching of the transistors, as illustrated in FIGS. 8A and 8B. In the switching of the transistors, however, the inverter 300 has time periods in which a flow-through current If flows from the power supply VCC to the internal ground.

Figure 10:
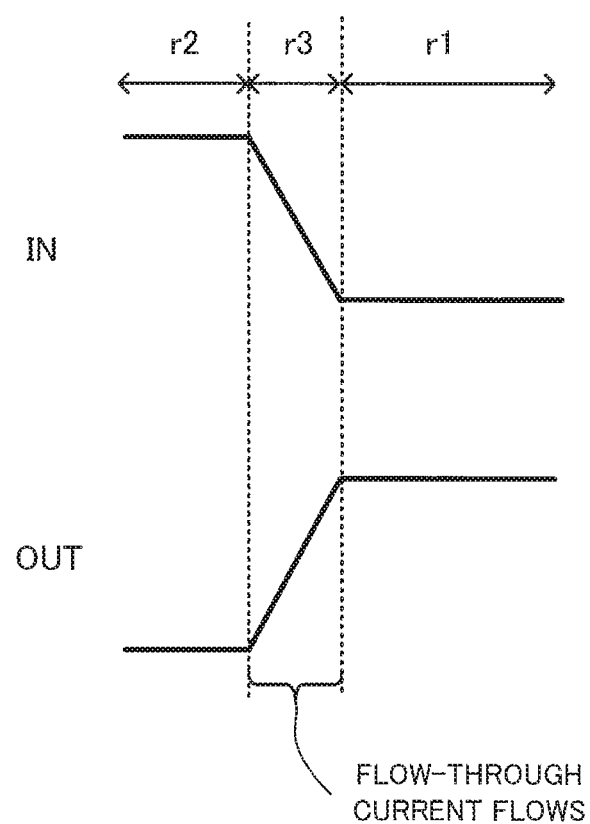
FIG. 10 illustrates waveforms in a CMOS operation.

FIG. 10 illustrates waveforms in a CMOS operation. In a region r1, the PMOS transistor M31 is turned on, and the NMOS transistor M32 is turned off (see FIG. 8A). In a region r2, the PMOS transistor M31 is turned off, and the NMOS transistor M32 is turned on (see FIG. 8B). In a region r3, the PMOS transistor M31 and the NMOS transistor M32 are both turned on.

Figure 11:
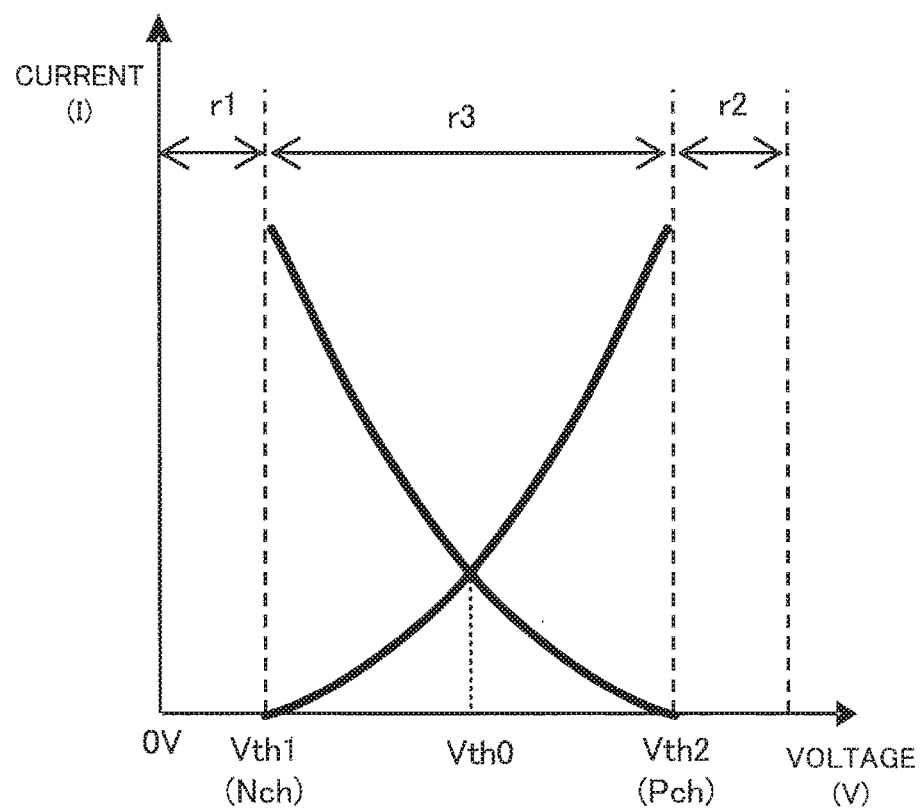
FIG. 11 illustrates CMOS characteristics.

FIG. 11 illustrates CMOS characteristics. The vertical axis represents current (I), and the horizontal axis represents voltage (V). A symbol Vth1 is an operational threshold voltage of the NMOS transistor M32. A symbol Vth2 is an operational threshold voltage of the PMOS transistor M31. A symbol Vth0 is an operational threshold voltage of the inverter 300.

Here, the CMOS (i.e. inverter 300) of the logic circuit 31 has the region r3 in which the PMOS transistor M31 and the NMOS transistor M32 are both turned on at the same time in their switching operations. At this time, the flow-through current If flows from the power supply VCC to the internal ground.

As a result, the flow-through current, which flows to the internal ground generated by the internal ground circuit 11a, causes the change of the internal ground. The internal ground is also supplied to the over temperature protection circuit 200. Thus, when the internal ground changes, it causes malfunction of the over temperature protection circuit 200, and reduces temperature detection accuracy of the over temperature protection circuit 200.

As described above, the semiconductor device 101 illustrated in FIG. 2 causes the internal ground outputted from the internal ground circuit 11 to change depending on increase or decrease of the electric charges of the charge pump 13. Because the internal ground, which is generated by the internal ground circuit 11, is shared by the charge pump 13 and the over temperature protection circuit 200, the internal ground causes malfunction of the over temperature protection circuit 200.

On the other hand, the semiconductor device 102 illustrated in FIG. 3 causes the internal ground outputted from the internal ground circuit 11a to change depending on the flow-through current produced when logic is changed in the logic circuit 31. Because the internal ground, which is generated by the internal ground circuit 11a, is supplied to the over temperature protection circuit 200, the internal ground causes malfunction of the over temperature protection circuit 200.

By the way, the above-described conventional art (See, for example, U.S. Patent Application Publication No. 2012/0287684) proposes the technique which regulates voltages by using a clamping voltage of a Zener diode.

In this technique, however, the clamping voltage of the Zener diode is adjusted to satisfy a certain voltage, and thus the additional process to adjust the clamping voltage is performed. In addition, because the change of the internal ground varies depending on variations in manufacture of the Zener diode, it is difficult to reliably prevent malfunction of the over temperature protection circuit, which is caused by the change of the internal ground.

The technique disclosed herein has been made in view of the above problems, and provides an over temperature protection circuit and a semiconductor device which prevent reduction in the temperature detection accuracy even when the internal ground changes.

Figure 12:
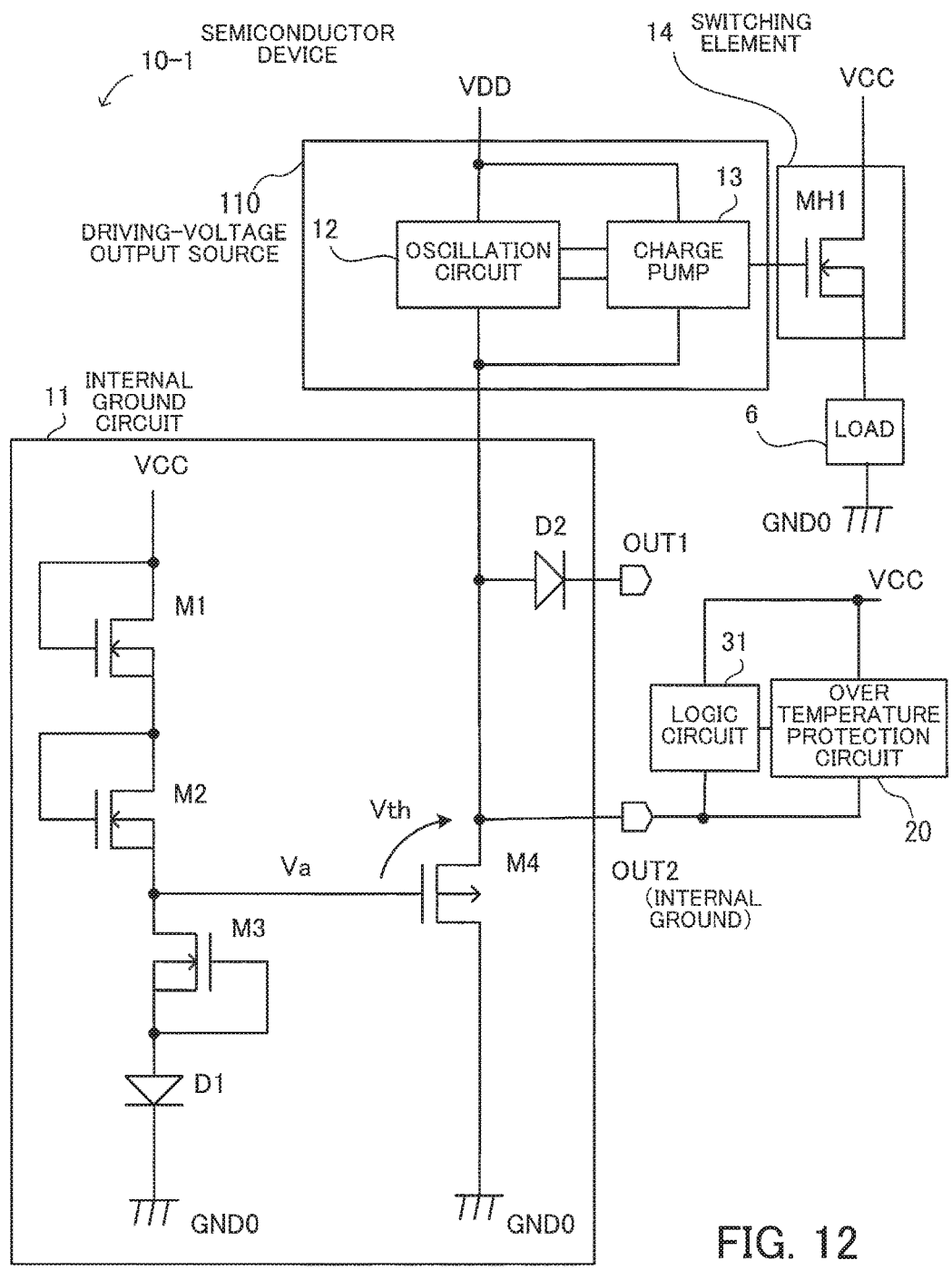
FIG. 12 illustrates an example of a configuration of a semiconductor device of the present disclosure.

Next, a semiconductor device and an over temperature protection circuit of the present disclosure will be described. FIG. 12 illustrates an example of a configuration of a semiconductor device of the present disclosure. A semiconductor device 10-1, which is an improvement of the semiconductor device 101, is connected to the load 6; and includes the internal ground circuit 11, the driving-voltage output source 110, the switching element 14, the logic circuit 31, and an over temperature protection circuit 20. The driving-voltage output source 110 includes the oscillation circuit 12 and the charge pump 13.

In the semiconductor device 10-1, the over temperature protection circuit 200 of the semiconductor device 101 illustrated in FIG. 4 is replaced by the over temperature protection circuit 20 of the present disclosure; and the other configurations are the same as those of the semiconductor device 101. The over temperature protection circuit 20 has the function of the over temperature protection circuit 1 illustrated in FIG. 1A.

Figure 13:
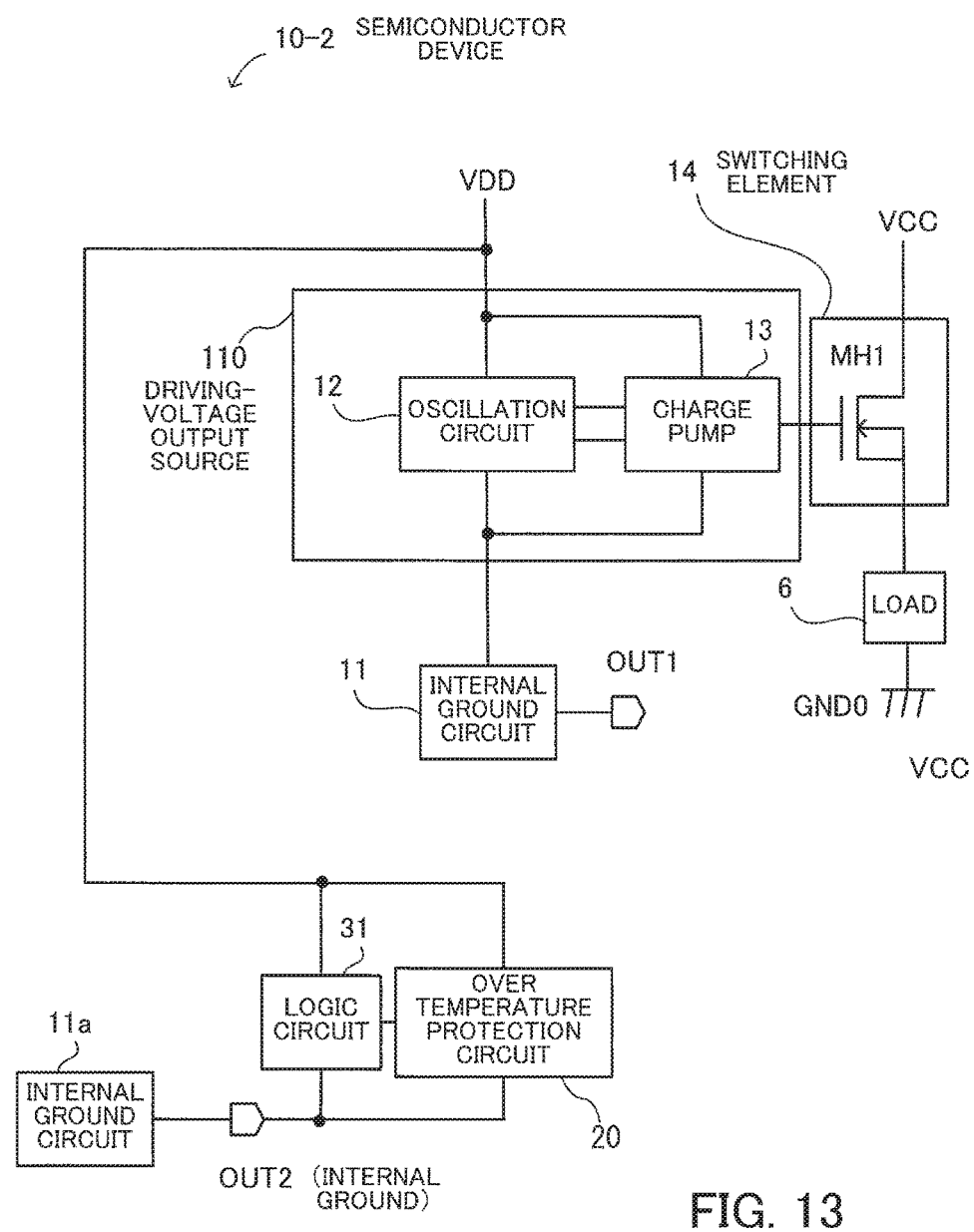
FIG. 13 illustrates an example of a configuration of a semiconductor device of the present disclosure.

FIG. 13 illustrates an example of a configuration of a semiconductor device of the present disclosure. A semiconductor device 10-2, which is an improvement of the semiconductor device 102, is connected to the load 6; and includes the internal ground circuits 11 and 11a, the driving-voltage output source 110, the switching element 14, the logic circuit 31, and the over temperature protection circuit 20 of the present disclosure. The driving-voltage output source 110 includes the oscillation circuit 12 and the charge pump 13.

Figure 14:
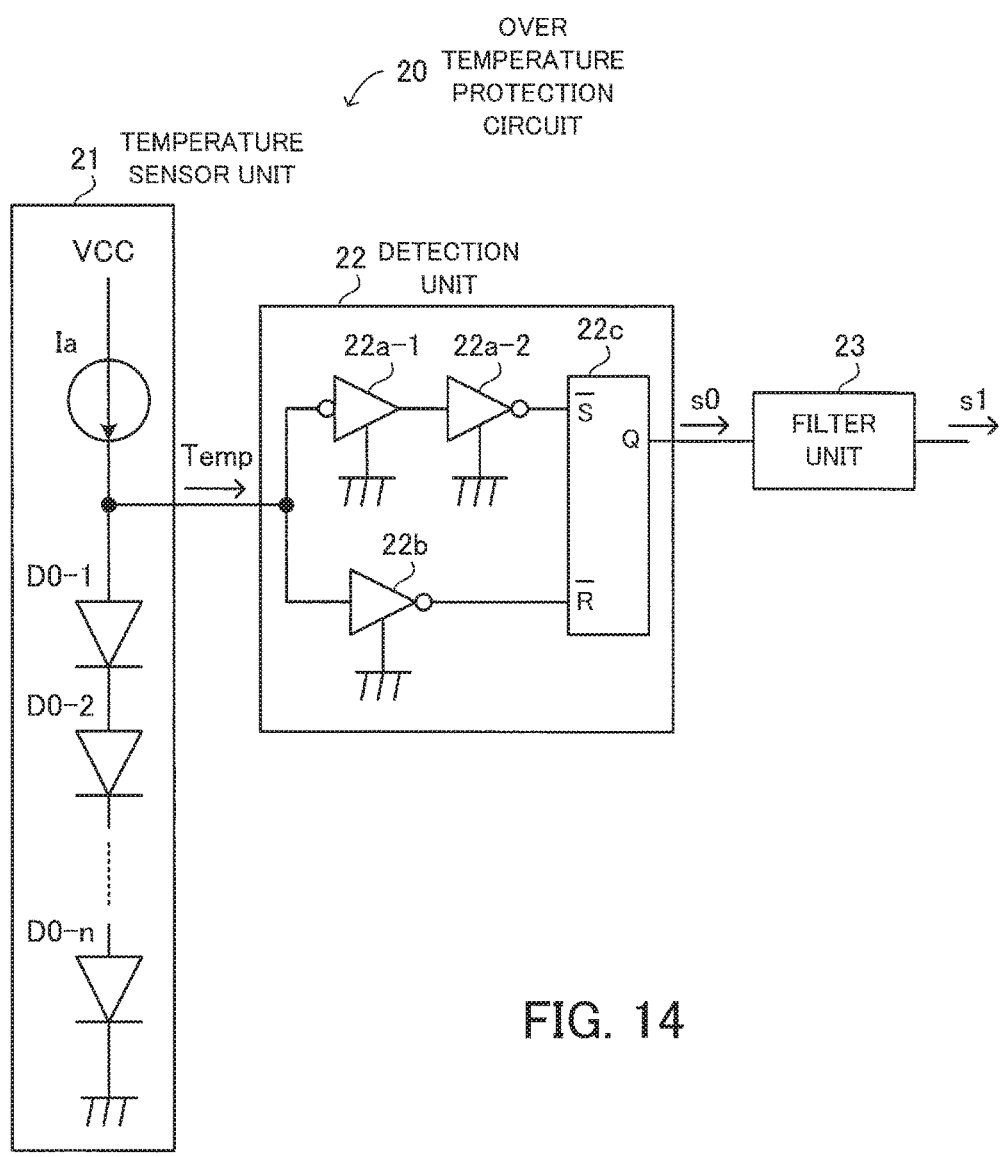
FIG. 14 illustrates an example of a configuration of an over temperature protection circuit.

FIG. 14 illustrates an example of a configuration of the over temperature protection circuit 20. The over temperature protection circuit 20 includes a temperature sensor unit 21, a detection unit 22, and a filter unit 23. The temperature sensor unit 21 corresponds to the temperature sensor unit 1a of FIG. 1A; the detection unit 22 corresponds to the detection unit 1b of FIG. 1A; and the filter unit 23 corresponds to the filter unit 1c of FIG. 1A.

The temperature sensor unit 21 includes a constant current source Ia and diodes D0-1 to D0-n. The detection unit 22 includes inverters 22a-1 and 22a-2, an inverter 22b, and an SR flip-flop 22c which serves as a latch circuit. The filter unit 23 includes, for example, a transistor and inverters (internal configuration of the filter unit 23 will be described later).

The temperature sensor unit 21 detects the temperature of the semiconductor device 10-1 or 10-2, and outputs the temperature detection signal Temp.

The detection unit 22 outputs the state signal s0, which indicates rise or fall in the temperature of the semiconductor device 10-1 or 10-2, based on the level of the temperature detection signal Temp. The filter unit 23 filters the state signal s0 by using a predetermined filtering process, and produces and outputs the state notification signal s1.

In the example of logic of the over temperature protection circuit 20, when the state signal s0 (state notification signal s1) has the H level, the semiconductor device 10-1 or 10-2 is in the over temperature state; when the state signal s0 (state notification signal s1) has the L level, the semiconductor device 10-1 or 10-2 is in the normal state. Accordingly, the following description will be made, based on the example of the above logic.

Circuit components are connected as follows. One end of the constant current source Ia is connected to the power supply VCC. The other end of the constant current source Ia is connected to the anode of the diode D0-1, the input terminal of the inverter 22a-1, and the input terminal of the inverter 22b.

The diodes D0-1 to D0-n are serially connected with each other such that the cathode of the diode D0-1 is connected to the anode of the next diode D0-2, the cathode of the diode D0-2 is connected to the anode of the next diode, and so on. The cathode of the diode D0-n is connected to the internal ground.

The output terminal of the inverter 22a-1 is connected to the input terminal of the inverter 22a-2. The output terminal of the inverter 22a-2 is connected to the set terminal of the SR flip-flop 22c. The output terminal of the inverter 22b is connected to the reset terminal of the SR flip-flop 22c.

The output terminal Q of the SR flip-flop 22c is connected to the input terminal of the filter unit 23. The ground input terminal of each circuit component is connected to the internal ground.

Hereinafter, the set terminal of the SR flip-flop 22c is denoted by the set terminal SN, and the reset terminal thereof is denoted by the reset terminal RN ("N" means that a function is active in negative logic).

Next, the temperature sensor unit 21 will be described. The temperature sensor unit 21 uses the diodes D0-1 to D0-n, which may be silicon diodes, and causes the constant current source Ia to flow a constant amount of forward current through the diodes D0-1 to D0-n. Here, a voltage across the diodes D0-1 to D0-n changes with temperature. Thus, the temperature sensor unit 21 outputs the voltage as the temperature detection signal Temp, which indicates a temperature detection result.

Figure 15:
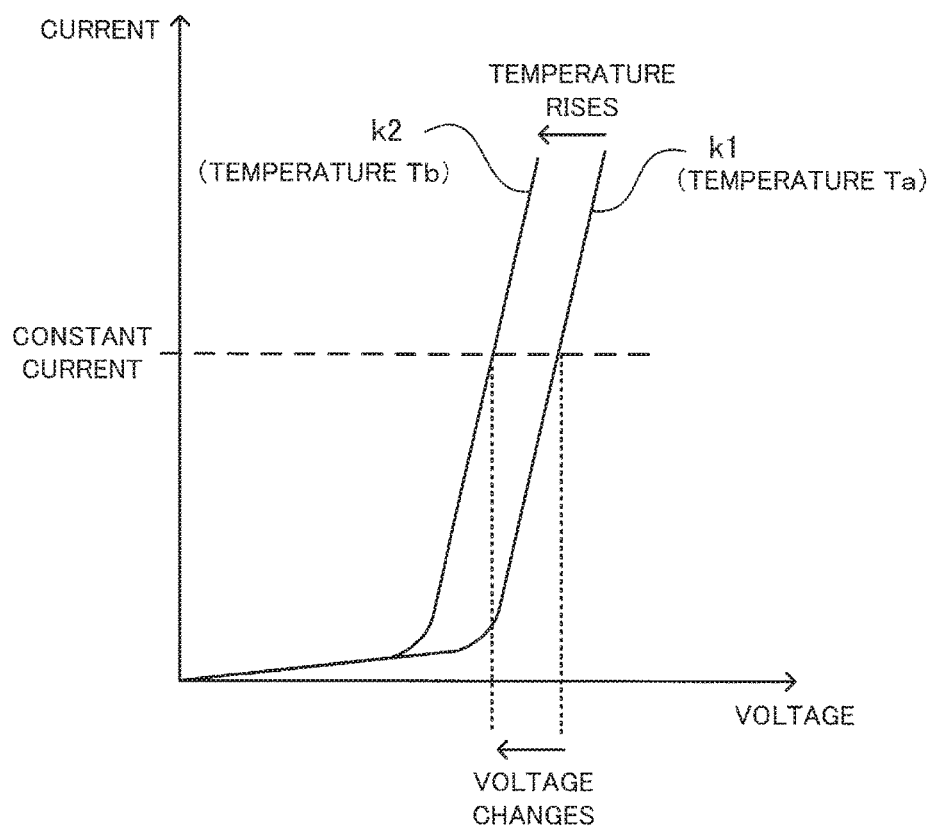
FIG. 15 illustrates a characteristic between voltage and current of a diode.

FIG. 15 illustrates a characteristic between voltage and current of a silicon diode. The vertical axis represents current, and the horizontal axis represents voltage.

It is known that the forward voltage of silicon diodes changes with temperature, and that the forward voltage decreases when the temperature rises. That is, silicon diodes have temperature dependence of the forward voltage.

In the example of FIG. 15, as the temperature changes from Ta to Tb (Ta<Tb), the forward voltage characteristic changes from a forward characteristic curve k1 to a forward characteristic curve k2. That is, when the temperature rises while a constant amount of forward current flows through the diode, the forward voltage characteristic changes from the forward characteristic curve k1 to the forward characteristic curve k2, causing the voltage across the diode to decrease.

In this manner, the temperature sensor unit causes the constant current source Ia to flow a constant amount of current through the diodes D0-1 to D0-n, and outputs a forward voltage between the anode of the diode D0-1 and the cathode of the diode D0-n, as the temperature detection signal Temp, by using the temperature dependence of the forward voltage of diodes.

Next, the detection unit 22 will be described. The inverters 22a-1 and 22b of the detection unit 22 receive the temperature detection signal Temp, which changes with the temperature of the semiconductor device 10-1 or 10-2.

In addition, a logic threshold voltage of the inverters 22a-1 and 22a-2 is different from that of the inverter 22b. The over temperature state and the normal state of the semiconductor devices 10-1 and 10-2 are detected by the inverters having the two different logic threshold voltages. The inverters determine a signal level higher than a logic threshold voltage, as the H level, and a signal level lower than the logic threshold voltage, as the L level.

Furthermore, since the detection unit 22 includes the SR flip-flop 22c in addition to the inverters 22a-1, 22a-2, and 22b, the detection unit 22 has hysteresis characteristics, which causes the detection unit 22 to respond to a large change in the temperature, but not respond to a small change in the temperature.

Figure 16:
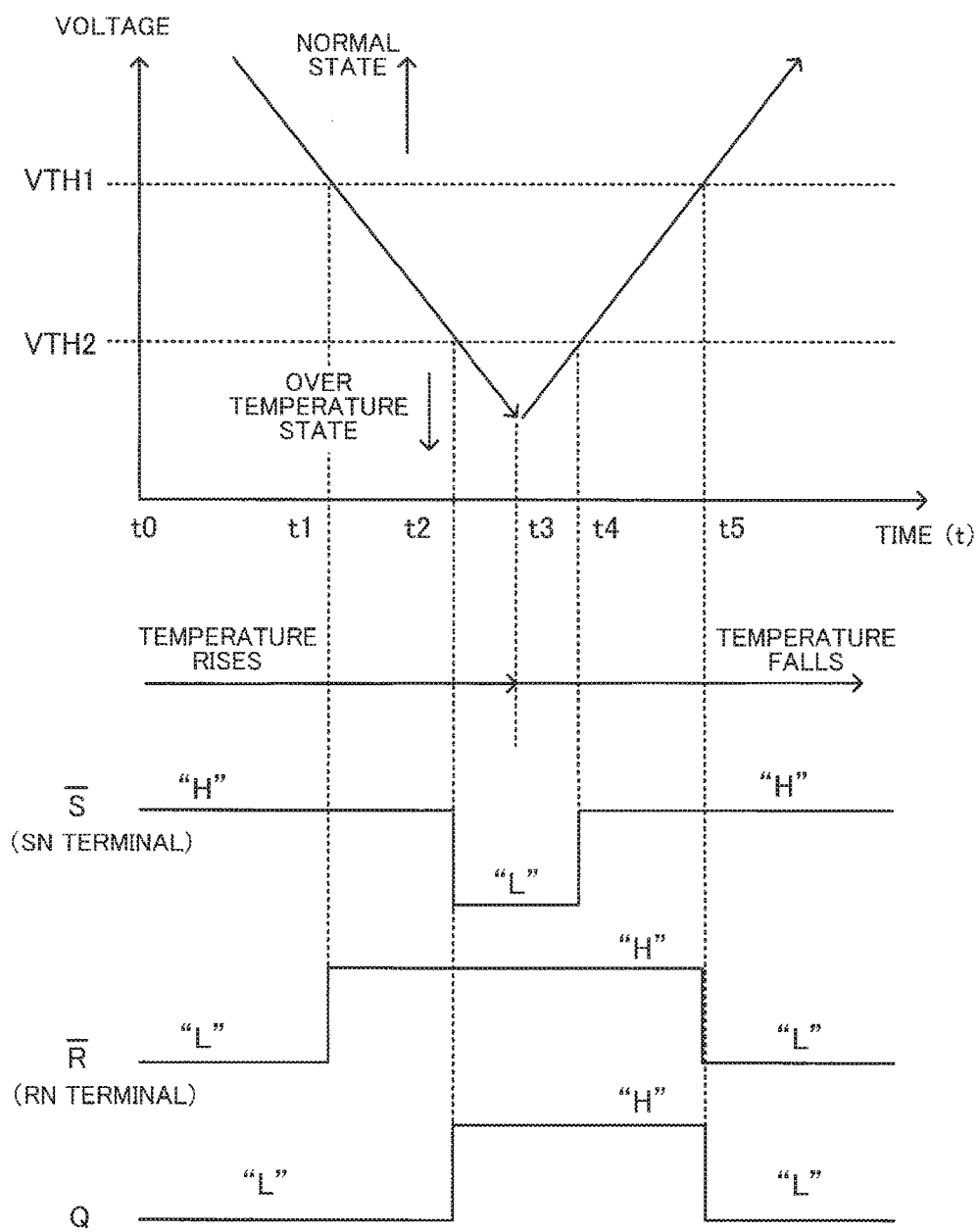
FIG. 16 is a diagram for explaining an operation of a detection unit.
Figure 17:
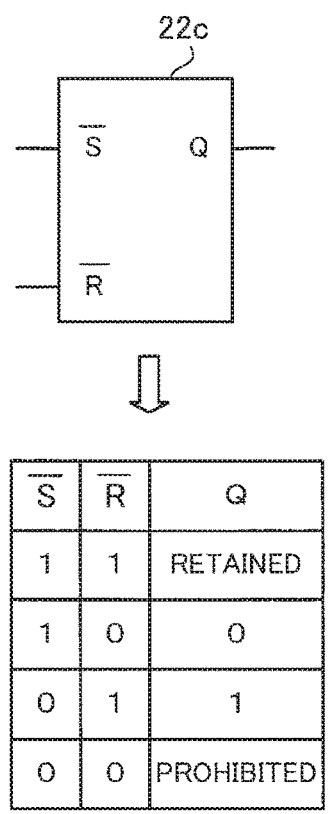
FIG. 17 illustrates a truth table of an SR flip-flop.

FIG. 16 is a diagram for explaining an operation of the detection unit 22. FIG. 16 illustrates a change of the temperature detection signal Temp caused when the temperature of the semiconductor device 10-1 or 10-2 rises or falls, and an operational timing chart of the SR flip-flop 22c which changes in accordance with the change of the temperature detection signal Temp. The vertical axis represents voltage, and the horizontal axis represents time (t). FIG. 17 illustrates a truth table of the SR flip-flop 22c.

An over temperature recovery detection threshold VTH1 (a first threshold) is a threshold for determining whether the semiconductor device 10-1 or 10-2 is in the normal state. An over temperature protection threshold VTH2 (a second threshold) is a threshold for determining whether the semiconductor device 10-1 or 10-2 is in the over temperature state. The over temperature recovery detection threshold VTH1 is higher than the over temperature protection threshold VTH2.

When the level (detection level) of the temperature detection signal Temp is equal to or higher than the over temperature recovery detection threshold VTH1, the semiconductor device 10-1 or 10-2 is in the normal state in temperature. The over temperature recovery detection threshold VTH1 is equal to the logic threshold voltage of the inverter 22b (a first logic circuit).

When the level of the temperature detection signal Temp is equal to or lower than the over temperature protection threshold VTH2, the semiconductor device 10-1 or 10-2 is in the over temperature state. The over temperature protection threshold VTH2 is equal to the logic threshold voltage of the inverters 22a-1 and 22a-2 (second logic circuits).

When the level of the temperature detection signal Temp is higher than the over temperature protection threshold VTH2 and lower than the over temperature recovery detection threshold VTH1, the semiconductor device 10-1 or 10-2 is in a temperature state in the preceding time interval. Hereinafter, the above description will be made in detail for each time interval.

When the temperature of the semiconductor device 10-1 or 10-2 rises, the level of the temperature detection signal Temp, which is outputted from the temperature sensor unit 21, falls with the rise in the temperature.

[t0≤t≤t1] The level of the temperature detection signal Temp is equal to or higher than the over temperature recovery detection threshold VTH1. Since the over temperature recovery detection threshold VTH1 is equal to the logic threshold voltage of the inverter 22b, the level of the temperature detection signal Temp is the H level for the inverter 22b. As a result, the inverter 22b outputs a signal having the L level, causing the reset terminal RN of the SR flip-flop 22c to have the L level.

In addition, the level of the temperature detection signal Temp is higher than the over temperature protection threshold VTH2. Since the over temperature protection threshold VTH2 is equal to the logic threshold voltage of the inverter 22a-1, the level of the temperature detection signal Temp is the H level for the inverter 22a-1. As a result, the inverter 22a-1 outputs a signal having the L level, causing the inverter 22a-2 to output a signal having the H level, and the set terminal SN of the SR flip-flop 22c to have the H level.

Thus, in the SR flip-flop 22c, since the set terminal SN has the H level and the reset terminal RN has the L level, the output terminal Q outputs a signal having the L level.

[t1<t<t2] The level of the temperature detection signal Temp is lower than the over temperature recovery detection threshold VTH1. Since the over temperature recovery detection threshold VTH1 is equal to the logic threshold voltage of the inverter 22b, the level of the temperature detection signal Temp is the L level for the inverter 22b. As a result, the inverter 22b outputs a signal having the H level, causing the reset terminal RN of the SR flip-flop 22c to have the H level.

In addition, the level of the temperature detection signal Temp is higher than the over temperature protection threshold VTH2. Since the over temperature protection threshold VTH2 is equal to the logic threshold voltage of the inverter 22a-1, the level of the temperature detection signal Temp is the H level for the inverter 22a-1. As a result, the inverter 22a-1 outputs a signal having the L level, causing the inverter 22a-2 to output a signal having the H level, and the set terminal SN of the SR flip-flop 22c to have the H level.

Thus, in the SR flip-flop 22c, since the set terminal SN has the H level and the reset terminal RN has the H level, the output terminal Q outputs a signal having the L level because the SR flip-flop 22c retains the output level (L level) in the preceding time interval.

[t2≤t≤t3] The level of the temperature detection signal Temp is lower than the over temperature recovery detection threshold VTH1. Since the over temperature recovery detection threshold VTH1 is equal to the logic threshold voltage of the inverter 22b, the level of the temperature detection signal Temp is the L level for the inverter 22b. As a result, the inverter 22b outputs a signal having the H level, causing the reset terminal RN of the SR flip-flop 22c to have the H level.

In addition, the level of the temperature detection signal Temp is equal to or lower than the over temperature protection threshold VTH2. Since the over temperature protection threshold VTH2 is equal to the logic threshold voltage of the inverter 22a-1, the level of the temperature detection signal Temp is the L level for the inverter 22a-1. As a result, the inverter 22a-1 outputs a signal having the H level, causing the inverter 22a-2 to output a signal having the L level, and the set terminal SN of the SR flip-flop 22c to have the L level.

Thus, in the SR flip-flop 22c, since the set terminal SN has the L level and the reset terminal RN has the H level, the output terminal Q outputs a signal having the H level.

Here, the temperature detection signal Temp starts falling at a time t3. When the temperature of the semiconductor device 10-1 or 10-2 falls, the level of the temperature detection signal Temp, which is outputted from the temperature sensor unit 21, increases with the fall in the temperature.

[t3<t≤t4] The level of the temperature detection signal Temp is equal to or lower than the over temperature protection threshold VTH2. Since the over temperature protection threshold VTH2 is equal to the logic threshold voltage of the inverter 22a-1, the level of the temperature detection signal Temp is the L level for the inverter 22a-1. As a result, the inverter 22a-1 outputs a signal having the H level, causing the inverter 22a-2 to output a signal having the L level, and the set terminal SN of the SR flip-flop 22c to have the L level.

In addition, the level of the temperature detection signal Temp is lower than the over temperature recovery detection threshold VTH1. Since the over temperature recovery detection threshold VTH1 is equal to the logic threshold voltage of the inverter 22b, the level of the temperature detection signal Temp is the L level for the inverter 22b. As a result, the inverter 22b outputs a signal having the H level, causing the reset terminal RN of the SR flip-flop 22c to have the H level.

Thus, in the SR flip-flop 22c, since the set terminal SN has the L level and the reset terminal RN has the H level, the output terminal Q outputs a signal having the H level.

[t4<t<t5] The level of the temperature detection signal Temp is higher than the over temperature protection threshold VTH2. Since the over temperature protection threshold VTH2 is equal to the logic threshold voltage of the inverter 22a-1, the level of the temperature detection signal Temp is the H level for the inverter 22a-1. As a result, the inverter 22a-1 outputs a signal having the L level, causing the inverter 22a-2 to output a signal having the H level, and the set terminal SN of the SR flip-flop 22c to have the H level.

In addition, the level of the temperature detection signal Temp is lower than the over temperature recovery detection threshold VTH1. Since the over temperature recovery detection threshold VTH1 is equal to the logic threshold voltage of the inverter 22b, the level of the temperature detection signal Temp is the L level for the inverter 22b. As a result, the inverter 22b outputs a signal having the H level, causing the reset terminal RN of the SR flip-flop 22c to have the H level.

Thus, in the SR flip-flop 22c, since the set terminal SN has the H level and the reset terminal RN has the H level, the output terminal Q outputs a signal having the H level because the SR flip-flop 22c retains the output level (H level) in the preceding time interval.

[t5≤t] The level of the temperature detection signal Temp is higher than the over temperature protection threshold VTH2. Since the over temperature protection threshold VTH2 is equal to the logic threshold voltage of the inverter 22a-1, the level of the temperature detection signal Temp is the H level for the inverter 22a-1. As a result, the inverter 22a-1 outputs a signal having the L level, causing the inverter 22a-2 to output a signal having the H level, and the set terminal SN of the SR flip-flop 22c to have the H level.

In addition, the level of the temperature detection signal Temp is equal to or higher than the over temperature recovery detection threshold VTH1. Since the over temperature recovery detection threshold VTH1 is equal to the logic threshold voltage of the inverter 22b, the level of the temperature detection signal Temp is the H level for the inverter 22b. As a result, the inverter 22b outputs a signal having the L level, causing the reset terminal RN of the SR flip-flop 22c to have the L level.

Thus, in the SR flip-flop 22c, since the set terminal SN has the H level and the reset terminal RN has the L level, the output terminal Q outputs a signal having the L level.

As illustrated in FIG. 16, the detection unit 22 determines the temperature state as the over temperature state and outputs the state signal s0 having the H level, when the level of the temperature detection signal Temp is equal to or lower than the over temperature protection threshold VTH2. In addition, the detection unit 22 determines the temperature state as the normal state and outputs the state signal s0 having the L level, when the level of the temperature detection signal Temp is equal to or higher than the over temperature recovery detection threshold VTH1.

When the temperature rises, and when the level of the temperature detection signal Temp is between the over temperature recovery detection threshold VTH1 and the over temperature protection threshold VTH2, the detection unit 22 determines that the over temperature state is not reached, and continues to output the state signal s0 having the L level.

When the temperature falls, and when the level of the temperature detection signal Temp is between the over temperature recovery detection threshold VTH1 and the over temperature protection threshold VTH2, the detection unit 22 determines that the normal state is not reached, and continues to output the state signal s0 having the H level.

Next, the filter unit 23 will be described. The filter unit 23 filters the state signal s0 outputted from the detection unit 22, suppresses the incorrect change of the state signal s0 caused by the change of the internal ground, and outputs the state notification signal s1 whose incorrect change is removed.

Figure 18:
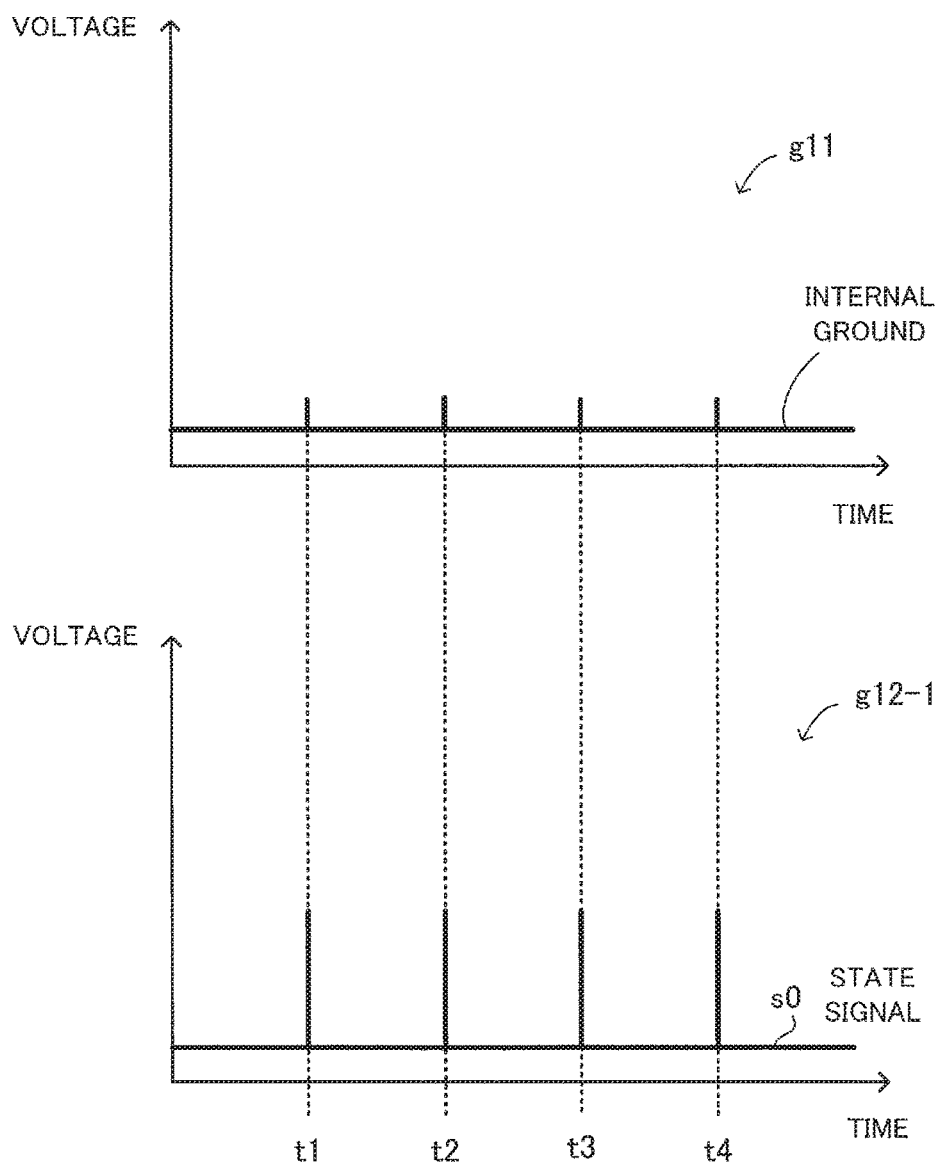
FIG. 18 illustrates a state where the state signal incorrectly changes.

FIG. 18 illustrates a state where the state signal incorrectly changes. A graph g11 illustrates the internal ground, and a graph g12-1 illustrates the state signal s0. The vertical axis represents voltage, and the horizontal axis represents time.

As described above, when the switching between charging and discharging in the charge pump 13 causes the gate voltage of the PMOS transistor M4 to change, the internal ground also changes in accordance with the change of the gate voltage.

As indicated at times t1 to t4, when the internal ground changes, the state signal s0 outputted from the detection unit 22 also changes incorrectly. For example, when the internal ground changes and has its higher voltage, a voltage between the temperature detection signal Temp and the internal ground decreases. In this case, when the temperature of the semiconductor device 10-1 or 10-2 is near the over temperature protection threshold, the semiconductor device 10-1 or 10-2 may be determined to be in the over temperature state with a slight temperature change.

Figure 19:
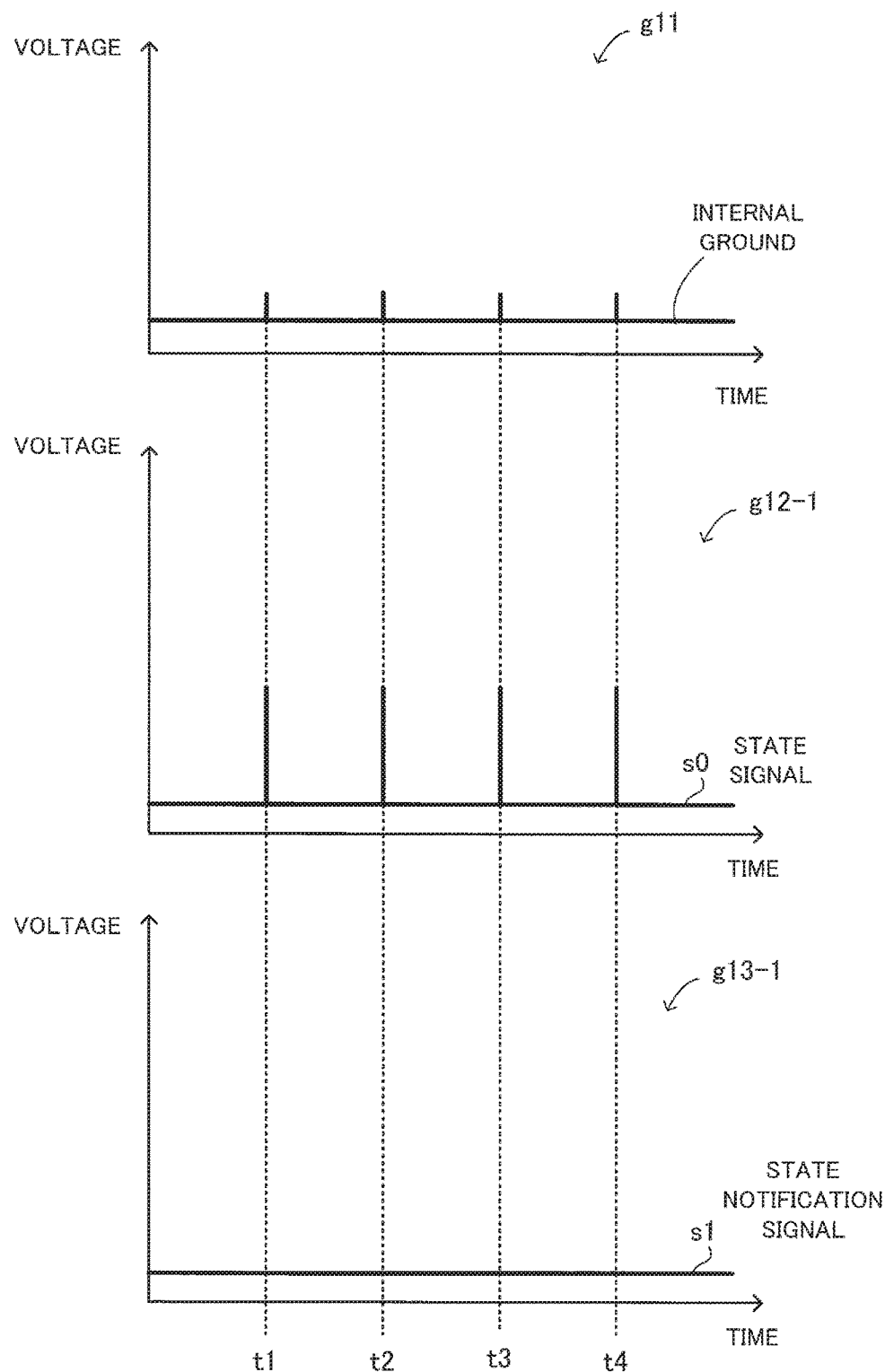
FIG. 19 illustrates the state notification signal outputted from a filter unit.

FIG. 19 illustrates the state notification signal outputted from the filter unit. The graph g11 illustrates the internal ground; the graph g12-1 illustrates the state signal s0; and a graph g13-1 illustrates the state notification signal s1. The vertical axis represents voltage, and the horizontal axis represents time.

As indicated at the times t1 to t4, when the internal ground changes, the state signal s0 outputted from the detection unit 22 also changes incorrectly. However, since the filter unit 23 filters the state signal s0, the filter unit 23 outputs the state notification signal s1 whose incorrect change is suppressed.

Thus, in the present disclosure, there is provided the filter unit 23 disposed after the detection unit 22, so that the incorrect change of the internal ground is suppressed. With this configuration, reduction in the temperature detection accuracy is more efficiently prevented with a few additional circuits, without significantly changing the circuit configuration.

Figure 20:
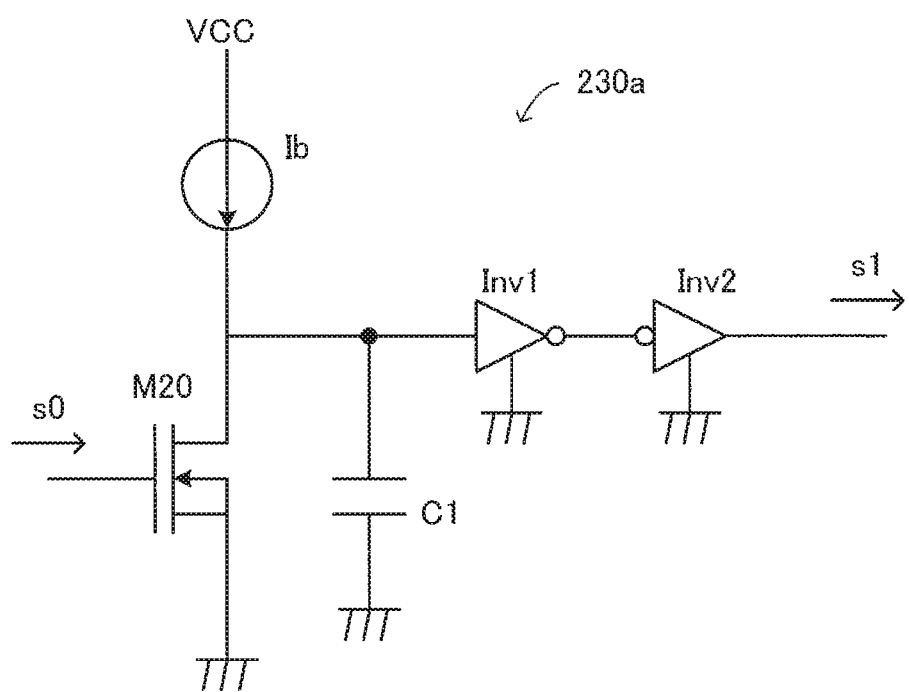
FIG. 20 illustrates one example of a circuit configuration of the filter unit.

Next, an example of a configuration of the filter unit 23 will be described. The filter unit 23 is constituted by a delay circuit including, for example, inverters and a transistor. FIG. 20 illustrates one example of a circuit configuration of the filter unit. A filter unit 230a includes a constant current source Ib, an NMOS transistor M20, a capacitor C1, and inverters Inv1 and Inv2. The capacitor C1, the NMOS transistor M20, and the constant current source Ib constitute a time constant circuit whose time constant is determined by the capacitance of the capacitor C1, a resistance component of the NMOS transistor M20, and a resistance component of the constant current source Ib.

One end of the constant current source Ib is connected to the power supply VCC. The other end of the constant current source Ib is connected to the drain of the NMOS transistor M20, one end of the capacitor C1, and the input terminal of the inverter Inv1. The gate of the NMOS transistor M20 is connected to the output terminal Q of the SR flip-flop 22c illustrated in FIG. 14. The source of the NMOS transistor M20 is connected to the internal ground.

The output terminal of the inverter Inv1 is connected to the input terminal of the inverter Inv2. The ground terminals of the capacitor C1 and the Inverters Inv1 and Inv2 are connected to the internal ground.

In the case where an inverter is disposed immediately after the output terminal of the SR flip-flop 22c, the NMOS transistor M20 may be replaced by a PMOS transistor.

In such a configuration, the state signal s0 produced in the over temperature state and having the H level turns on the NMOS transistor M20, and then current flows from the constant current source Ib to the capacitor C1, so that a filtering process is performed. Then, the waveform of the filtered signal is shaped by the inverters Inv1 and Inv2, and is outputted as the state notification signal s1.

Figure 21:
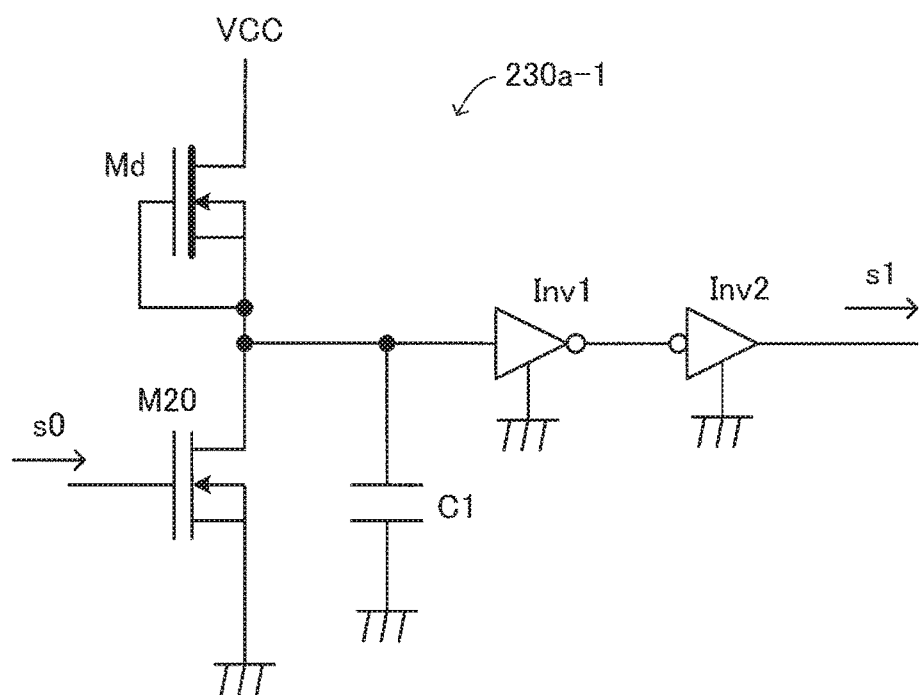
FIG. 21 illustrates one example of a circuit configuration of the filter unit.

FIG. 21 illustrates one example of a circuit configuration of the filter unit. A filter unit 230a-1 includes an NMOS transistor Md, the NMOS transistor M20, the capacitor C1, and the inverters Inv1 and Inv2. The NMOS transistor Md is a depletion type transistor, and is used as the constant current source Ib illustrated in FIG. 20. The depletion type transistor flows current between the drain and the source thereof, with a gate voltage of 0V and is used as a current source.

The drain of the NMOS transistor Md is connected to the power supply VCC. The gate of the NMOS transistor Md is connected to the source of the NMOS transistor Md, the drain of the NMOS transistor M20, one end of the capacitor C1, and the input terminal of the inverter Inv1. The other connections are the same as those of FIG. 20.

Figure 22:
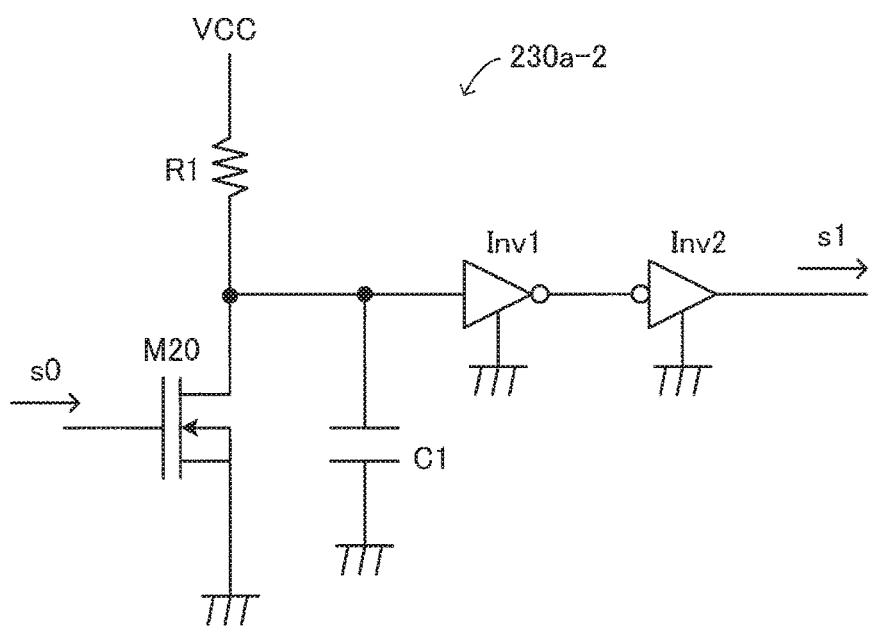
FIG. 22 illustrates one example of a circuit configuration of the filter unit.

FIG. 22 illustrates one example of a circuit configuration of the filter unit. A filter unit 230a-2 includes a resistor R1, the NMOS transistor M20, the capacitor C1, and the inverters Inv1 and Inv2. The resistor R1 is used as the constant current source Ib illustrated in FIG. 20.

One end of the resistor R1 is connected to the power supply VCC. The other end of the resistor R1 is connected to the drain of the NMOS transistor M20, one end of the capacitor C1, and the input terminal of the inverter Inv1. The other connections are the same as those of FIG. 20.

Figure 23:
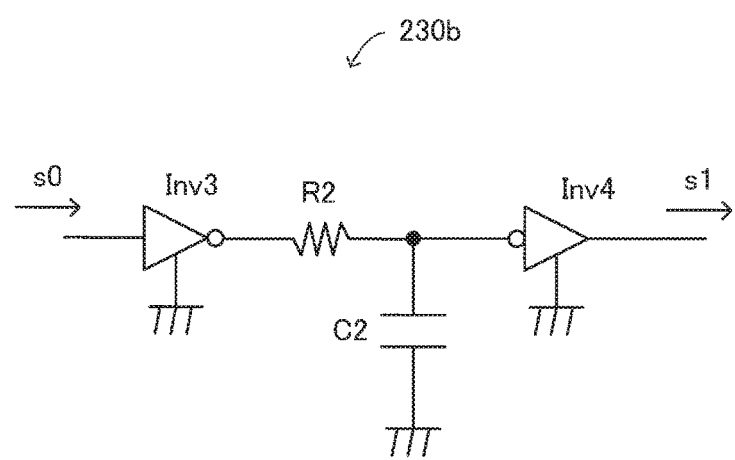
FIG. 23 illustrates one example of a circuit configuration of the filter unit.

FIG. 23 illustrates one example of a circuit configuration of the filter unit. A filter unit 230b includes an inverter Inv3 (a first inverter), an inverter Inv4 (a second inverter), a resistor R2, and a capacitor C2. The resistor R2 and the capacitor C2 constitute a time constant circuit.

The input terminal of the inverter Inv3 is connected to the output terminal Q of the SR flip-flop 22c of FIG. 14. The output terminal of the inverter Inv3 is connected to one end of the resistor R2. The other end of the resistor R2 is connected to one end of the capacitor C2 and the input terminal of the inverter Inv4. The other end of the capacitor C2 and the ground terminals of the inverters Inv3 and Inv4 are connected to the internal ground.

Figure 24:
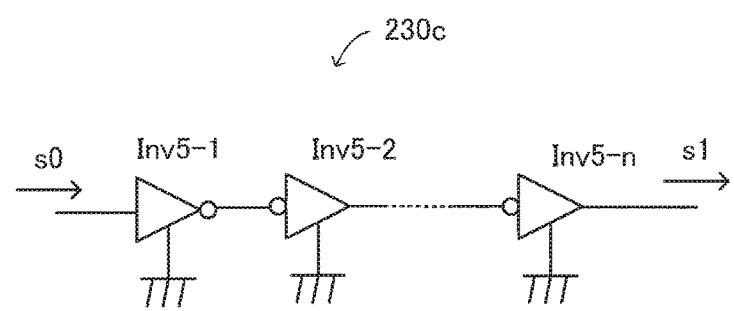
FIG. 24 illustrates one example of a circuit configuration of the filter unit.

FIG. 24 illustrates one example of a circuit configuration of the filter unit. A filter unit 230c includes inverters Inv5-1, Inv5-2, ..., and Inv5-n.

These inverters are serially connected with each other such that the input terminal of the inverter Inv5-1 is connected to the output terminal Q of the SR flip-flop 22c of FIG. 14, the output terminal of the inverter Inv5-1 is connected to the input terminal of the next inverter Inv5-2, the output terminal of the inverter Inv5-2 is connected to the input terminal of the next inverter inv5-3, and so on. The ground terminals of the Inverters Inv5-1 to Inv5-n are connected to the internal ground. In such a manner, the filter unit 23 may be achieved by a delay circuit in which a plurality of inverters are serially connected with each other.

Figure 25:
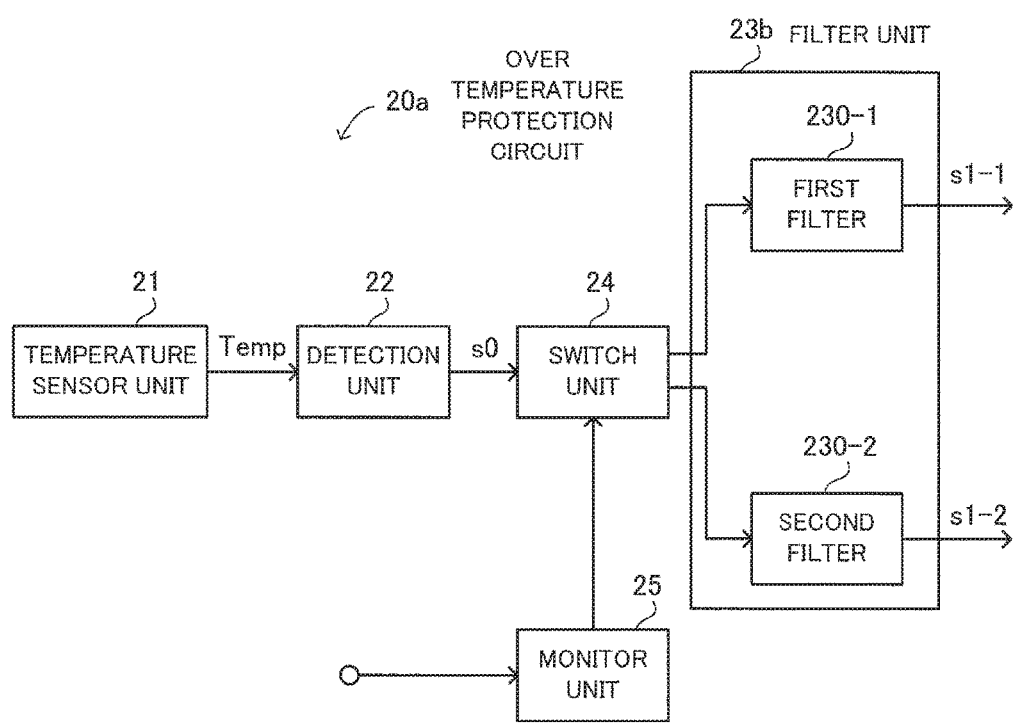
FIG. 25 illustrates a configuration of a modification of the over temperature protection circuit.
Figure 26:
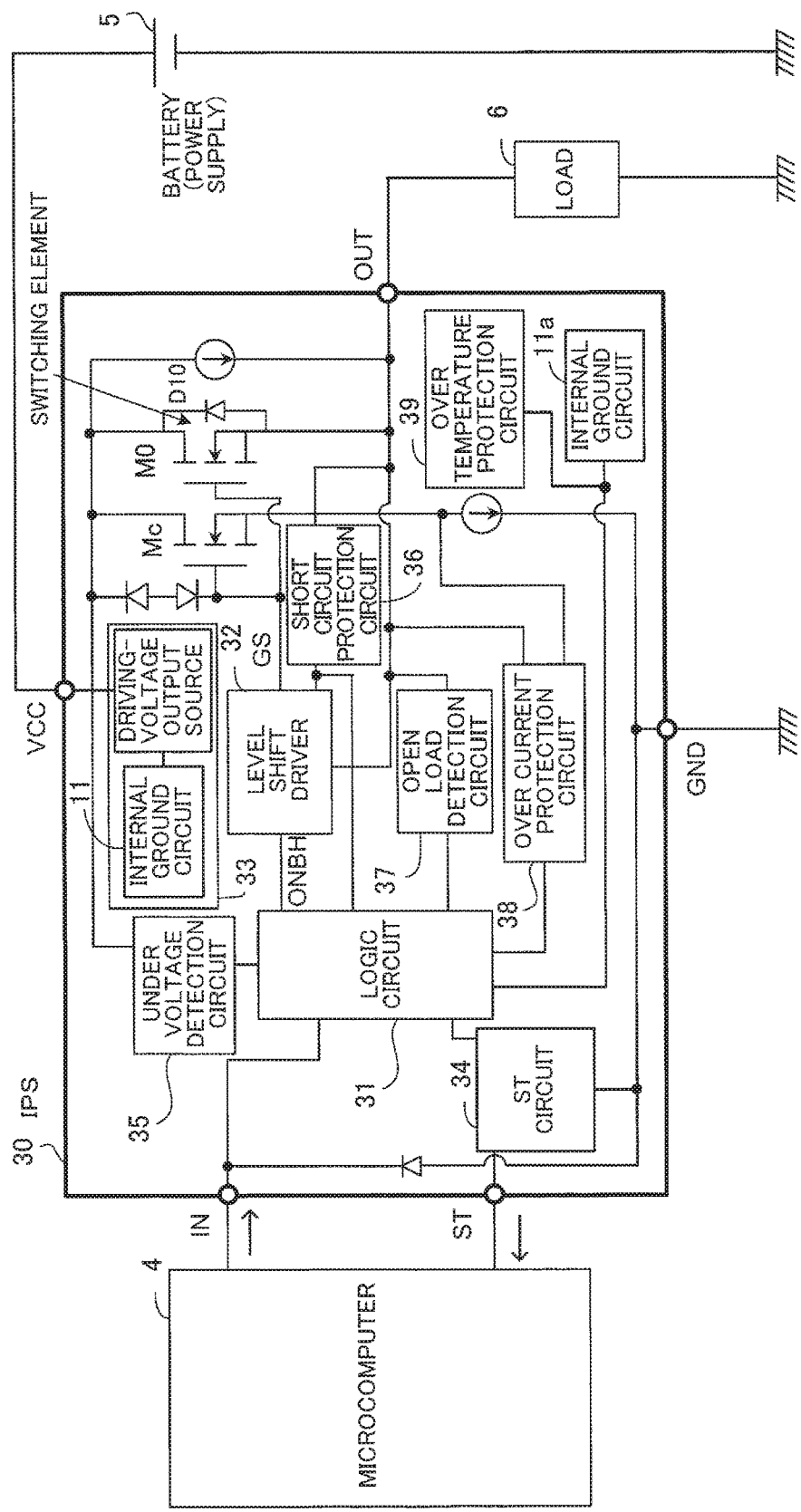
FIG. 26 illustrates an example of a configuration of a high-side IPS.

Next, a modification of the over temperature protection circuit 20 will be described. FIG. 25 illustrates a configuration of a modification of the over temperature protection circuit. An over temperature protection circuit 20a includes the temperature sensor unit 21, the detection unit 22, a switch unit 24, a monitor unit 25, and a filter unit 23b. The switch unit 24, the monitor unit 25, and the filter unit 23b are additionally included in the modification, and will be described.

The filter unit 23b includes a first filter 230-1 and a second filter 230-2. The first filter 230-1 applies a low-pass filter to the state signal s0 sent via the switch unit 24, and produces and outputs a state notification signal s1-1. The second filter 230-2 applies another low-pass filter to the state signal s0 sent via the switch unit 24, and produces and outputs a state notification signal s1-2.

The input terminal of the monitor unit 25 is connected to, for example, the drain of the PMOS transistor M4 illustrated in FIG. 6. The monitor unit 25 monitors the amount (e.g. amplitude) of the change of the internal ground, and outputs a monitor result to the switch unit 24.

When the switch unit 24 determines, based on the monitor result, that the amount of the change of the internal ground exceeds a predetermined threshold, the switch unit 24 selects the first filter 230-1, and sends the state signal s0, outputted from the detection unit 22, to the first filter 230-1.

When the switch unit 24 determines, based on the monitor result, that the amount of the change of the internal ground does not exceed the predetermined threshold, the switch unit 24 selects the second filter 230-2, and sends the state signal s0, outputted from the detection unit 22, to the second filter 230-2.

A filtering characteristic of the first filter 230-1 and a filtering characteristic of the second filter 230-2 are different from each other. For example, the first filter 230-1 has a larger time constant than that of the second filter 230-2.

In such a configuration, when the amount of the change of the internal ground exceeds a predetermined threshold, the first filter 230-1, which has a larger time constant than that of the second filter 230-2, is selected for filtering the state signal s0. Thus, the incorrect change of the state signal s0 is reliably suppressed.

When the amount of the change of the internal ground does not exceed the predetermined threshold, the second filter 230-2, which has a smaller time constant than that of the first filter 230-1, is selected for filtering the state signal s0. Thus, the incorrect change of the state signal s0 is reliably suppressed without unnecessarily distorting the waveform of the state notification signal.

With the configuration of such a modification, an appropriate filtering process is performed in accordance with the change of the internal ground.

Next, an example of a configuration of an IPS to which the semiconductor device 10-2 of the present disclosure is applied will be described. FIG. illustrates an example of a configuration of a high-side IPS.

An IPS 30 is connected to the load 6, a microcomputer 4, and a battery 5. The IPS 30 includes the logic circuit 31, a level shift driver 32, an internal power supply circuit 33, a status (ST) circuit 34, an under voltage detection circuit 35, a short circuit protection circuit 36, an open load detection circuit 37, the internal ground circuit 11a, an over current protection circuit 38, and an over temperature protection circuit 39. The over temperature protection circuit 39 has the function of the over temperature protection circuit 1 of the present disclosure.

The IPS 30 further includes a switching element M0 for driving the load 6. The switching element M0 is connected to a diode D10 (FWD: Free Wheel Diode), and serves as the switching element 14 (which includes the NMOS transistor MH1) illustrated in FIG. 13.

The moment the switching element M0 is turned off, counter electromotive force occurs in the load 6, which is an inductive load such as a motor. For this reason, the diode D10 is connected, in antiparallel, with the switching element M0 to return the load current to the switching element M0.

The logic circuit 31 determines control signals inputted from the microcomputer 4 via a terminal IN, and state detection signals inputted from the protection circuits, all together; and outputs an ONBH (ON Bar H) signal to control the switching element M0.

The level shift driver 32 receives the ONBH signal outputted from the logic circuit 31, boosts the ONBH signal into a GS signal having a level to fully turn on the switching element M0, and applies the GS signal to the gate of the switching element M0. The level shift driver 32 includes the functions of the above-described oscillation circuit 12 and the charge pump 13.

The internal power supply circuit 33 generates a power supply voltage, as an internal power supply voltage, which is increased, step by step, from a voltage lower than the power supply voltage VCC, and supplies the internal power supply voltage to circuits which are controlled by the internal power supply voltage. The internal power supply circuit 33 includes the functions of the internal ground circuit 11 and the driving-voltage output source 110.

The ST circuit 34 sends a signal indicating the operation state of the switching element M0, to the microcomputer 4 via an ST terminal.

The under voltage detection circuit 35 sends an error signal to the logic circuit 31 when the power supply voltage VCC is lower than a rated voltage. Upon receiving the error signal sent from the under voltage detection circuit 35, the logic circuit 31 outputs the ONBH signal having a level to turn off the switching element M0.

The short circuit protection circuit 36 sends an error signal to the logic circuit 31 when an output terminal OUT connected to the source of the switching element M0 is short-circuited to the ground. Upon receiving the error signal sent from the short circuit protection circuit 36, the logic circuit 31 outputs the ONBH signal having a level to turn off the switching element M0.

The open load detection circuit 37 sends an error signal to the logic circuit 31 when the output terminal OUT connected to the source of the switching element M0 is opened. Upon receiving the error signal sent from the open load detection circuit 37, the logic circuit 31 outputs the ONBH signal having a level to turn off the switching element M0.

The over current protection circuit 38 detects current which flows from a transistor Mc constituting a current mirror circuit together with the switching element M0, and which has a magnitude equal to that of current flowing through the switching element M0. The over current protection circuit 38 sends an error signal to the logic circuit 31, when the over current protection circuit 38 detects current having a magnitude higher than a rated value. Upon receiving the error signal sent from the over current protection circuit 38, the logic circuit 31 outputs the ONBH signal having a level to turn off the switching element M0.

The over temperature protection circuit 39 sends an error signal (that is, the state notification signal s1) to the logic circuit 31 when, for example, the switching element M0 has a temperature higher than a rated temperature. Upon receiving the error signal sent from the over temperature protection circuit 39, the logic circuit 31 outputs the ONBH signal having a level to turn off the switching element M0.

Some embodiments have been described in the above. In the present disclosure, any configuration of each part of the embodiments may be replaced by another configuration having the same function. In addition, any other component or process may be added to the above-described embodiments.

According to one aspect, reduction in temperature detection accuracy is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An over temperature protection circuit comprising:
a temperature sensor unit configured to detect a temperature and output a temperature detection signal;
a detection unit configured to determine, based on comparing the temperature detection signal to a first threshold and a second threshold, whether the temperature corresponds to a normal temperature state corresponding to the first threshold or an over temperature state corresponding to the second threshold and to output a state signal according to the determination, and to operate with respect to an internal ground; and
a filter unit configured to filter out a change of the state signal, produced in accordance with a change of the internal ground.

2. The over temperature protection circuit according to claim 1, wherein
the filter unit includes a transistor, a current source, a capacitor, and an inverter;
the current source and the capacitor constitute a time constant circuit; and
the filter unit is configured to
turn on the transistor in accordance with a level of the state signal in the over temperature state,
flow a signal from the current source to the time constant circuit,
filter the signal with a predetermined time constant, and
cause the inverter to shape a waveform of a signal outputted from the time constant circuit, and to output a waveform-shaped signal.

3. The over temperature protection circuit according to claim 1, wherein
the filter unit includes a first inverter, a second inverter, a resistor, and a capacitor;
the resistor and the capacitor constitute a time constant circuit; and
the filter unit is configured to
cause the first inverter to receive the state signal,
cause the time constant circuit to filter a signal outputted from the first inverter, and
cause the second inverter to shape a waveform of a signal outputted from the time constant circuit, and to output a waveform-shaped signal.

4. The over temperature protection circuit according to claim 1, wherein
the filter unit includes a plurality of inverters serially connected with each other, and
the plurality of inverters are configured to perform filtering process.

5. The over temperature protection circuit according to claim 1, wherein
the detection unit is configured to determine the temperature state as the over temperature state and output the state signal having a first level when the detection level is equal to or lower than the second threshold, determine the temperature state as the normal state and output the state signal having a second level when the detection level is equal to or higher than the first threshold, output the state signal having the second level until the detection level reaches the second threshold, when temperature rises and the detection level is between the first threshold and the second threshold, and output the state signal having the first level until the detection level reaches the first threshold, when temperature falls and the detection level is between the first threshold and the second threshold.

6. The over temperature protection circuit according to claim 1, wherein the detection unit includes:
a first logic circuit configured to receive the temperature detection signal and having a logic threshold voltage equal to the first threshold,
a second logic circuit configured to receive the temperature detection signal and having a logic threshold voltage equal to the second threshold, and
a flip-flop circuit configured to receive a signal outputted from the first logic circuit and a signal outputted from the second logic circuit, and to output a signal having a level that is set according to levels of the received signals.

7. The over temperature protection circuit according to claim 1, wherein
a driving-voltage output source and an internal ground circuit are connected to the over temperature protection circuit,
the driving-voltage output source includes an oscillation circuit, and a charge pump configured to repeat charging and discharging with operation of the oscillation circuit and charge a capacitor until a voltage across the capacitor becomes a drive voltage for turning on a switching element, and
the internal ground circuit includes a voltage dividing circuit configured to divide a power supply voltage to produce a predetermined voltage, and a transistor having a gate and a drain and configured to receive, at the gate, the predetermined voltage, produce a voltage by adding the predetermined voltage to a voltage between the gate and the drain, and output the produced voltage from the drain, as the internal ground, the drain being connected to the driving-voltage output source.

8. The over temperature protection circuit according to claim 1, wherein
a logic circuit and an internal ground circuit are connected to the over temperature protection circuit,
the logic circuit includes CMOS components, and is configured to perform logic control, and
the internal ground circuit is configured to generate the internal ground and supply the internal ground to the logic circuit and the over temperature protection circuit.

9. The over temperature protection circuit according to claim 1, wherein
the filter unit includes a first filter and a second filter having filtering characteristics different from each other, and the over temperature protection circuit further includes:
a monitor unit configured to monitor an amount of change of the internal ground, and
a switch unit configured to switch the state signal and output the state signal to the first filter or the second filter, based on a monitor result.

10. A semiconductor device comprising:
a switching element configured to drive a load;
a driving-voltage output source including an oscillation circuit, and a charge pump configured to repeat charging and discharging with operation of the oscillation circuit and charge a capacitor until a voltage across the capacitor becomes a drive voltage for turning on the switching element;
an internal ground circuit including a voltage dividing circuit configured to divide a power supply voltage and produce a predetermined voltage, and a transistor having a gate and a drain and configured to receive, at the gate, the predetermined voltage, produce a voltage by adding the predetermined voltage to a voltage between the gate and the drain, and output the produced voltage from the drain, as an internal ground, the drain being connected to the driving-voltage output source; and
an over temperature protection circuit including:
a temperature sensor unit configured to detect a temperature and output a temperature detection signal,
a detection unit configured to determine, based on comparing the temperature detection signal to a first threshold and a second threshold, whether the temperature corresponds to a normal temperature state corresponding to the first threshold or an over temperature state corresponding to the second threshold and to output a state signal according to the determination, and to operate with respect to the internal ground, and
a filter unit configured to filter out a change of the state signal, produced in accordance with a change of the internal ground.

11. A semiconductor device comprising:
a logic circuit including CMOS components and configured to perform logic control;
an over temperature protection circuit including:
a temperature sensor unit configured to detect a temperature and output a temperature detection signal,
a detection unit configured to determine, based on comparing the temperature detection signal to a first threshold and a second threshold, whether the temperature corresponds to a normal temperature state corresponding to the first threshold or an over temperature state corresponding to the second threshold and to output a state signal based on the determination, and to operate with respect to an internal ground, and
a filter unit configured to filter out a change of the state signal, produced in accordance with a change of the internal ground; and
an internal ground circuit configured to generate the internal ground and supply the internal ground to the logic circuit and the over temperature protection circuit.

* * * * *